(12) United States Patent
Nagata et al.

(10) Patent No.: US 10,324,346 B2
(45) Date of Patent: Jun. 18, 2019

(54) DISPLAY DEVICE

(71) Applicant: SHARP KABUSHIKI KAISHA, Sakai, Osaka (JP)

(72) Inventors: Kosuke Nagata, Sakai (JP); Masayuki Hata, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 15/747,591

(22) PCT Filed: Jul. 28, 2016

(86) PCT No.: PCT/JP2016/072140
§ 371 (c)(1),
(2) Date: Jan. 25, 2018

(87) PCT Pub. No.: WO2017/022614
PCT Pub. Date: Feb. 9, 2017

(65) Prior Publication Data
US 2018/0217465 A1 Aug. 2, 2018

(30) Foreign Application Priority Data
Aug. 3, 2015 (JP) ................................. 2015-153389

(51) Int. Cl.
*G02F 1/1333* (2006.01)
*G02F 1/1362* (2006.01)
(Continued)

(52) U.S. Cl.
CPC ...... *G02F 1/136286* (2013.01); *G02F 1/1333* (2013.01); *G02F 1/1343* (2013.01);
(Continued)

(58) Field of Classification Search
CPC .................................................... G02F 1/1362
See application file for complete search history.

(56) References Cited

U.S. PATENT DOCUMENTS

| 6,573,962 B1* | 6/2003 | Tateno | G02F 1/13394 |
| | | | 349/115 |
| 2011/0187965 A1* | 8/2011 | Ooishi | G09F 13/04 |
| | | | 349/62 |

(Continued)

FOREIGN PATENT DOCUMENTS

| JP | 2001-305971 | * 11/2001 | .......... G02F 1/1333 |
| JP | 2009-186971 | * 8/2009 | .......... G02F 1/1345 |

(Continued)

*Primary Examiner* — Sang V Nguyen
(74) *Attorney, Agent, or Firm* — ScienBiziP, P.C.

(57) ABSTRACT

A liquid crystal display device 10 includes a backlight device 12 exiting light, a liquid crystal panel 11 disposed on a light exit side with respect to the backlight device 12, a first conductive layer 31, and a conductive bonding member 32. The liquid crystal panel 11 includes an array substrate 11*b*, a CF substrate 11*a* overlapping the array substrate 11*b* on an opposite side from the backlight device 12 side, and a first polarizing plate 11*d* disposed on the backlight device 12 side with respect to the array substrate 11*b*. The first conductive layer 31 is disposed on a plate surface of one of the array substrate 11*b* and the first polarizing plate 11*d*. The conductive bonding member 32 is electrically connected to the first conductive layer 31 to bond the backlight device 12 and the liquid crystal panel 11 and connected to ground.

14 Claims, 12 Drawing Sheets

(51) Int. Cl.
*G02F 1/1343* (2006.01)
*G02F 1/1335* (2006.01)
*G02F 1/1368* (2006.01)
*G06F 3/041* (2006.01)
*H01L 27/12* (2006.01)
*H05K 1/18* (2006.01)

(52) U.S. Cl.
CPC ........ *G02F 1/1368* (2013.01); *G02F 1/13338* (2013.01); *G02F 1/133512* (2013.01); *G02F 1/133514* (2013.01); *G02F 1/133536* (2013.01); *G06F 3/0412* (2013.01); *H01L 27/124* (2013.01); *H05K 1/189* (2013.01); *G02F 2201/121* (2013.01); *G02F 2201/123* (2013.01); *G06F 2203/04107* (2013.01); *H05K 2201/10136* (2013.01)

(56) References Cited

U.S. PATENT DOCUMENTS

| | | | | |
|---|---|---|---|---|
| 2012/0140135 | A1* | 6/2012 | Yokonuma | G02F 1/1336 349/37 |
| 2013/0229596 | A1* | 9/2013 | Hosoki | F21V 21/00 349/65 |
| 2014/0293144 | A1* | 10/2014 | Bae | G06F 3/041 349/12 |
| 2015/0369467 | A1* | 12/2015 | Saito | H05K 3/305 362/345 |
| 2017/0127166 | A1* | 5/2017 | Noma | H04R 7/16 |
| 2017/0212395 | A1* | 7/2017 | Hirata | G02F 1/133345 |

FOREIGN PATENT DOCUMENTS

| | | | | |
|---|---|---|---|---|
| JP | 2015-084017 | * | 4/2015 | ........ G02F 1/1345 |
| JP | 2015-084017 A | | 4/2015 | |

* cited by examiner

DISPLAY DEVICE

TECHNICAL FIELD

The present invention relates to a display device.

BACKGROUND ART

A liquid crystal display disclosed in Patent Document 1 has been known as an example of conventional liquid crystal display devices. The liquid crystal display device disclosed in Patent Document 1 includes a first board, a second board, a first polarizing plate, and a second polarizing plate. The first and the second boards are opposed to each other with a liquid crystal layer therebetween. The first polarizing plate is disposed on a front surface of the first board. The second polarizing plate is disposed on an image display surface of the second board. Ends of the second polarizing plate, a conductive film, the first board, and the first polarizing plate are formed stepwise. The liquid crystal display device further includes a conductive tape disposed along a shape of the steps to electrically connect the first polarizing plate and the conductive film to a ground. One of ends of the conductive tape is electrically connected to an exposed surface of the conductive film and the other end of the conductive tape is electrically connected to an opposed surface of the first polarizing plate exposed from the end of the first board. The first polarizing plate is made of a conductive material having conductivity. Potentials of the conductive film and the first polarizing plate are held at a ground potential.

RELATED ART DOCUMENT

Patent Document

Patent Document 1: Unexamined Japanese Patent Application Publication No. 2015-84017

Problem to be Solved by the Invention

In Patent Document 1, the conductive film and the first polarizing plate are electrically connected with the conductive tape disposed along the shape of the steps formed by the ends of the second polarizing plate, the conductive film, the first circuit board, and the first polarizing plate. Placing the conductive tape along the shape of the steps and connecting the conductive tape to the conductive film and the first polarizing plate are not very efficient in terms of workability. Furthermore, a contact area between the conductive tape and the conductive film and a contact area between the conductive tape and the first polarizing plate tend to be small. Therefore, sufficient reliability cannot be achieved in connection. Still furthermore, the first polarizing plate needs to be processed in a special shape to connect the conductive tape to the first polarizing plate.

DISCLOSURE OF THE PRESENT INVENTION

The present invention was made in view of the above circumstances. An object is to solve the problems related to ground connection.

Means for Solving the Problem

A display device according to the present technology includes a lighting device exiting light, a display panel disposed on a light exit side with respect to the lighting device, the display panel including a first substrate, a second substrate overlapping the first substrate on an opposite side from a lighting device side, and a polarizing plate disposed on the lighting device side with respect to the first substrate, a conductive layer disposed on a plate surface of one of the first substrate and the polarizing plate, and a conductive bonding member electrically connected to the conductive layer and bonding the lighting device and the display panel and connected to ground.

According to such a configuration, the conductive bonding member that is connected to ground is electrically connected to the conductive layer disposed on the plate surface of one of the first substrate and the polarizing plate included in the display panel. Therefore, the display panel is shielded. Even in a configuration of the display panel including a built-in touch panel pattern, sensitivity of touching is less likely to be lowered by the noise occurring from the lighting device side with respect to the display panel and functions of the touch panel can be appropriately exerted. It is preferable for achieving a multifunctional display panel.

The conductive bonding member that bonds the lighting device and the display panel is electrically connected to the conductive layer and supplies ground voltage to the conductive layer. An operation of connecting the conductive layer to ground is simplified and a sufficient contact area of the conductive layer and the conductive bonding member is obtained and high connection reliability is achieved. Furthermore, unlike the known configuration, the polarizing plate is not required to be formed in a special size or a special shape.

The following configurations may be preferable for embodiments according to the present invention.

(1) The display panel may include a display area displaying images and a non-display area surrounding the display area, and the conductive bonding member may be disposed to overlap the non-display area. According to such a configuration, the conductive bonding member is less likely to adversely affect images displayed in the display area. The material that is opaque and excellent in conductivity such as metal can be used as the material of the conductive bonding member and therefore, high connection reliability with the conductive layer can be obtained.

(2) The lighting device may include a light source disposed to overlap at least one side section of the non-display area, and the display panel may include the one side section overlapping the light source in the non-display area as a light source overlapping side section, and the conductive bonding member may have light blocking properties and may be disposed to overlap the light source overlapping side section of the non-display area. According to such a configuration, even if the light rays from the light source leak into the non-display area side of the display panel, the leaking light rays are blocked by the conductive bonding member disposed to overlap the light source overlapping side section of the non-display area. Accordingly, the leaking light rays are less likely to be seen in the non-display area of the display panel and display quality is improved.

(3) The display panel may include another side section of the non-display area that does not overlap the light source as a light source non-overlapping side section, the light source non-overlapping side section may be narrower than the light source overlapping side section, and the conductive bonding member may be disposed over an area overlapping an entire area of at least the light source overlapping side section. The conductive bonding member is at least formed in an area overlapping an entire area of the light source overlapping side section that is wider than the light source non-overlapping side sections. Therefore, a sufficient contact area of the conductive bonding member and the conductive layer is ensured, and high connection reliability between the conductive layer and the conductive bonding member can be obtained.

(4) The conductive bonding member may have an annular shape that is along a shape of the non-display area and the conductive bonding member may be disposed to overlap the light source non-overlapping side section in addition to the light source overlapping side section. According to such a configuration, the conductive bonding member that is formed in an annular shape along the shape of the non-display area and overlaps the light source non-overlapping side sections in addition to the light source overlapping side section is in contact with the conductive layer. Therefore, the contact area of the conductive bonding member and the conductive layer is further increased and the connection reliability of the conductive layer and the conductive bonding member is further increased.

(5) The display device may further include a lighting device power supply member for supplying power to the lighting device, and the conductive bonding member may be electrically connected to the lighting device power supply member. According to such a configuration, the conductive bonding member can be easily connected to ground via the lighting device power supply member for supplying power to the lighting device.

(6) The lighting device power supply member may include a light source emitting light, a light source mounting portion, a pull-out wiring portion, and a ground terminal. The light source mounting portion may have a mounting surface where the light source is mounted and a light source non-mounting surface opposite from the mounting surface, and the light source non-mounting surface may be opposite the display panel. The pull-out wiring portion may be pulled out from the light source mounting portion to an outside of the lighting device, and the ground terminal may be disposed on the light source non-mounting surface of the light source mounting portion. The conductive bonding member may be in contact with the light source non-mounting surface of the light source mounting portion and is electrically connected to the ground terminal. According to such a configuration, the conductive bonding member is disposed to be in contact with the light source non-mounting surface of the light source mounting portion included in the lighting device power supply member such that the conductive bonding member is electrically connected to the ground terminal on the light source non-mounting surface. Thus, the conductive layer is connected to ground.

(7) The display device may further include a second conductive layer disposed on a plate surface of the second substrate opposite from the first substrate side, a second polarizing plate bonded to a plate surface of the second substrate opposite from the first substrate side and disposed to expose a section of the second conductive layer as an exposed section, and a ground connection member having one end electrically connected to the exposed section of the second conductive layer and another end connected to ground. According to such a configuration, the second polarizing plate bonded to the plate surface of the second substrate opposite from the first substrate side is formed such that the second conductive layer that is disposed on the plate surface of the second substrate opposite from the first substrate side is partially exposed. The one end of the ground connection member is connected to the exposed section of the second conductive layer and the display panel is shielded. Even in a configuration of the display panel including a built-in touch panel pattern, sensitivity of touching is less likely to be lowered by the noise occurring from an opposite side from the lighting device side with respect to the display panel and functions of the touch panel can be appropriately exerted. It is preferable for achieving a multifunctional display panel.

(8) The display device may further include a ground pad disposed on a second substrate non-overlapping section of the first substrate, the second substrate non-overlapping section not overlapping the second substrate, and a display panel wiring member mounted on the first substrate and transmitting at least signals for displaying images and connecting the ground pad to ground. The ground connection member may be formed from conductive paste disposed to extend from the ground pad to the exposed section of the second conductive layer. According to such a configuration, the ground pad is connected to ground via the display panel wiring member mounted on the first substrate. Therefore, the second conductive layer of the second substrate that is connected to the ground pad of the first substrate is connected to ground via the ground connection member. A level difference corresponding to a thickness of the first substrate is between the second conductive member disposed on the first substrate and the ground pad disposed on the second substrate non-overlapping section of the first substrate. The ground connection member is formed from the conductive paste such that the ground connection member can be easily disposed to extend from the ground pad to the exposed section of the second conductive layer while covering the level difference and effective connection can be established.

(9) The display device may further include a lighting device power supplying member supplying power to the lighting device, and the display panel wiring member may include a connecting section that is electrically connected to the lighting device power supplying member. According to such a configuration, the lighting device power supplying member is electrically connected to the connecting section of the display panel wiring member such that the conductive layer and the second conductive layer are commonly connected to ground.

(10) The conductive layer may be disposed on a plate surface of the first substrate on a polarizing plate side. According to such a configuration, the electric connection between the conductive layer and the conductive bonding member can be established by arranging the conductive bonding member so as to overlap the first substrate on the polarizing plate side. In comparison to a configuration that the conductive layer is disposed on a plate surface of the polarizing plate opposite from the first substrate side, the conductive layer is arranged closer to the first substrate. Therefore, the shielding performance of shielding the first substrate is improved.

(11) The conductive bonding member may be disposed not to overlap the polarizing plate. Such a configuration is preferable for reducing a thickness in comparison to a configuration that the conductive bonding member is disposed to overlap the polarizing plate.

(12) The conductive layer may be formed from a transparent electrode film. According to such a configuration, high light transmissivity and high conductivity can be achieved.

(13) The conductive layer may be disposed on a plate surface of the polarizing plate opposite from a first substrate side. According to such a configuration, the conductive bonding member is disposed to overlap the polarizing plate on an opposite side from the first substrate side. Accordingly, electrical connection between the conductive layer and the conductive bonding member can be established. In comparison to a configuration including the conductive layer directly on the plate surface of the first substrate, the conductive layer can be disposed at a lower cost.

(14) The conductive layer may include a light transmissive base member and conductive particles contained in the light transmissive base member. According to such a configuration, a cost is preferably reduced in comparison to a configuration including the conductive layer formed from a transparent electrode film directly on the plate surface of the first substrate.

Advantageous Effect of the Invention

According to the present invention, the problems related to ground connection can be solved.

MODES FOR CARRYING OUT THE INVENTION

First Embodiment

A first embodiment of the present invention will be described with reference to FIGS. 1 to 9. In this section, a liquid crystal display device LCD will be described. X-axes, Y-axes, and Z-axes may be present in drawings. The axes in each drawing correspond to the respective axes in other drawings to indicate the respective directions. Upper sides and lower sides in FIGS. 2, 7, and 8 correspond to a front side and a rear side of the liquid crystal display device LCD, respectively.

Figure 1:
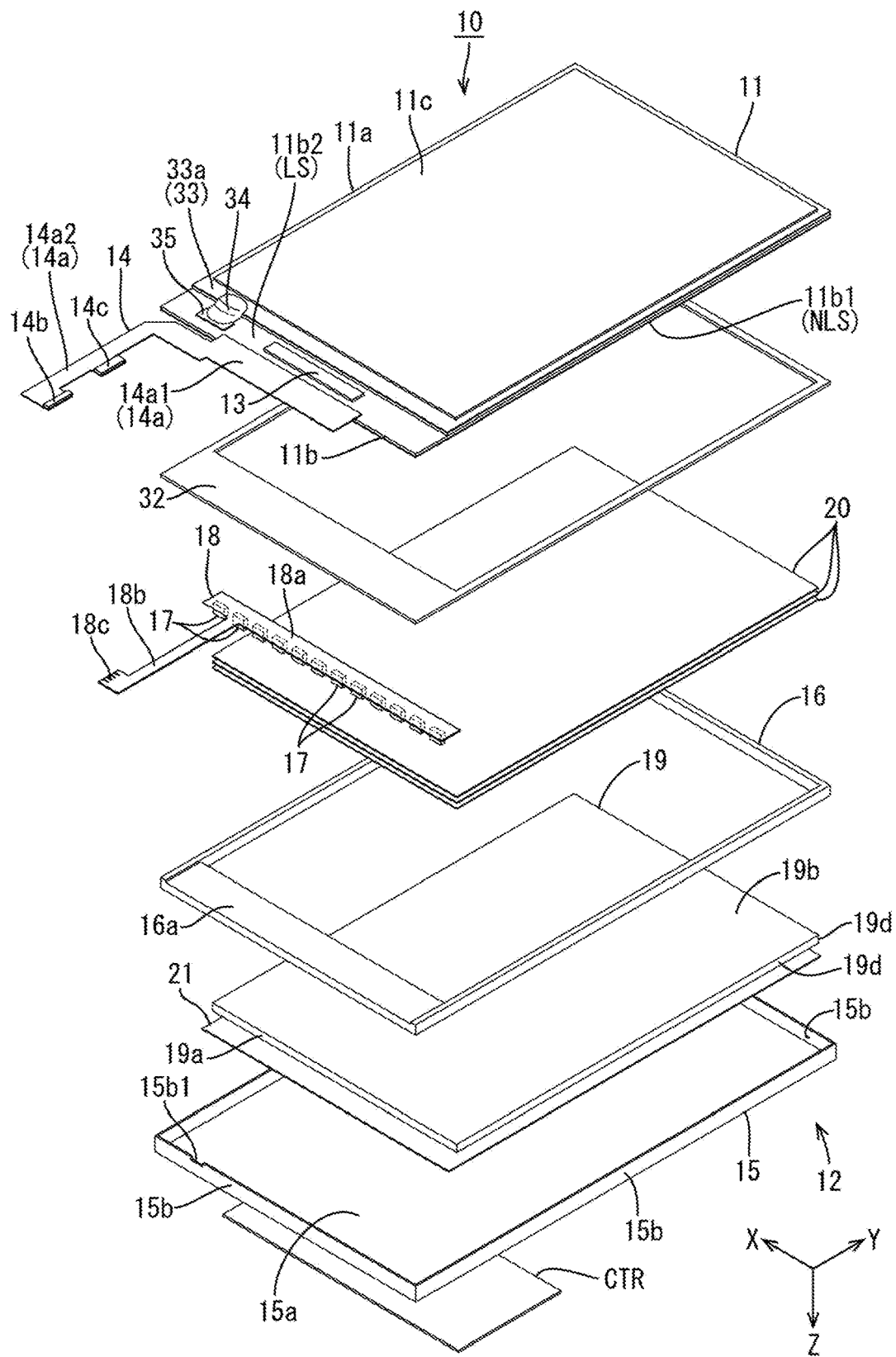
FIG. 1 is an exploded perspective view of a liquid crystal display device according to a first embodiment of the present invention.

The liquid crystal display device 10 has a rectangular overall shape. As illustrated in FIG. 1, the liquid crystal display device 10 includes a liquid crystal panel 11 (a display panel) and the backlight device 12 (a lighting device). The liquid crystal panel 11 is configured to display images. The backlight device 12 is an external light source disposed behind the liquid crystal panel 11 and configured to supply light for image display to the liquid crystal panel 11. A frame member, which is not illustrated, is disposed on a front side of the liquid crystal panel 11 and the frame member and the backlight device 12 sandwich and hold an outer edge portion of the liquid crystal panel 11 (a non-display area NAA which will be described later) therebetween. The liquid crystal display device 10 according to this embodiment may be used in various kinds of electronic devices (not illustrated) such as mobile phones (including smartphones), notebook computers (including tablet computers), wearable terminals (including smart watches), handheld terminals (including electronic books and PDAs), portable video game players, and digital photo frames. The liquid crystal panel 11 in the liquid crystal display device 10 is in a range between some inches to ten and some inches. Namely, the liquid crystal panel 11 is in a size that is classified as a small or a small-to-medium.

Figure 2:
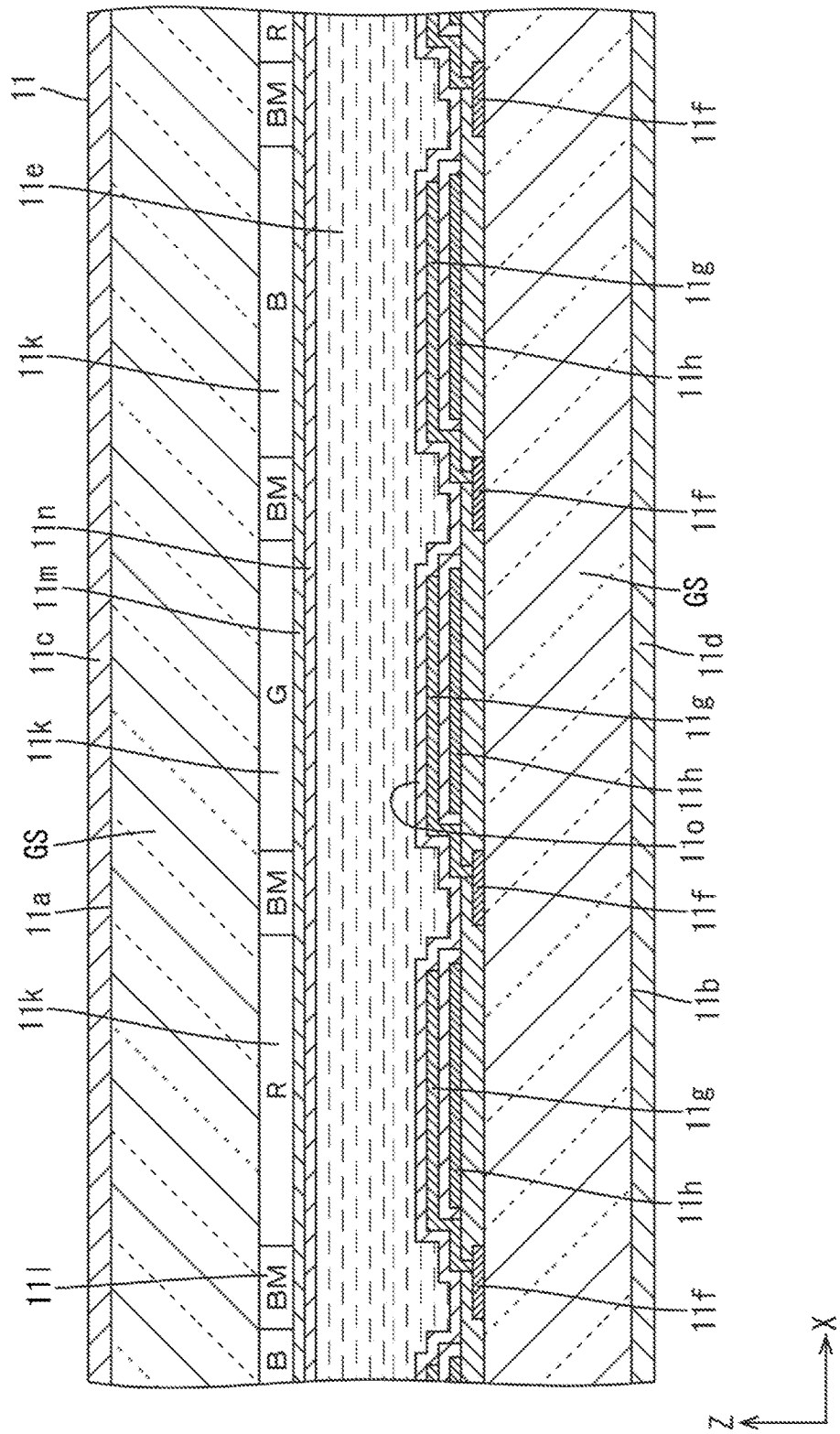
FIG. 2 is a schematic cross-sectional view illustrating a cross-sectional configuration of the liquid crystal panel in a display area.
Figure 6:
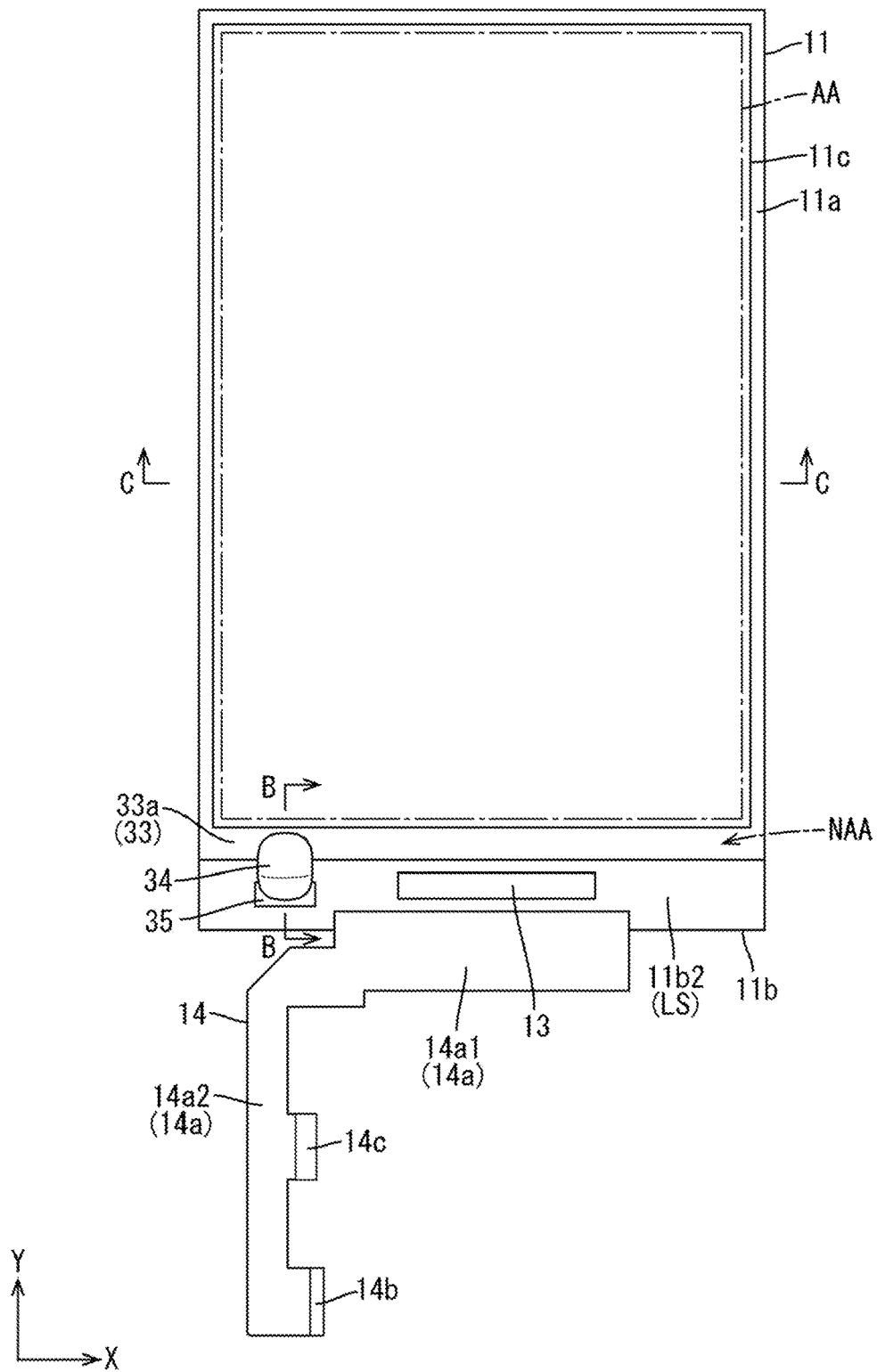
FIG. 6 is a schematic plan view illustrating a connection configuration of the liquid crystal panel and a flexible circuit board.

First, the liquid crystal panel 11 will be described in detail. The liquid crystal panel 11 has a rectangular overall shape in a plan view. As illustrated in FIG. 2, the liquid crystal panel 11 includes a pair of substantially transparent glass substrates 11a and 11b having high light transmissivity and a liquid crystal layer 11e between the substrates 11a and 11b. The liquid crystal layer 11e includes liquid crystal molecules that are substances with optical characteristics that vary according to application of an electric field. The substrates 11a and 11b are bonded together with a sealant while a gap corresponding to a thickness of the liquid crystal layer is maintained therebetween. As illustrated in FIG. 6, the liquid crystal panel 11 includes a display area AA (an active area) in which images are displayed and a non-display area NAA (a non-active area) in which images are not displayed. The display area AA is a center area of a screen and the non-display area NAA is a frame-shaped area (an annular area) which surrounds the display area AA. The short direction, the long direction, and the thickness direction of the liquid crystal panel 11 correspond with the Y-axis direction, the X-axis direction, and the Z-axis direction, respectively. In FIG. 6, a chain line slightly smaller than the CF substrate 11a in a frame shape indicates the display area AA and an area outside a solid line is the non-display area NAA.

One of the substrates 11a and 11b in the liquid crystal panel 11 on the front side is the CF substrate 11a (a second substrate, an opposed substrate) and one on the rear side (the back side) is an array substrate 11b (a first substrate, an active matrix substrate, a component substrate). As illustrated in FIG. 6, the CF substrate 11a has a short dimension about equal to a short dimension of the array substrate 11b and a long dimension smaller than a long dimension of the array substrate 11b. The CF substrate 11a is bonded to the array substrate 11b with one of ends of the long dimension (on the upper side in FIG. 6) aligned with that of the array substrate 11b. The other end of the long dimension of the array substrate 11b (on the lower side in FIG. 6) has a predefined section including a front surface and a back surface exposed to the outside without overlapping the CF substrate 11a. The section includes a mounting area in which a driver 13 (a panel driver, a display component driver) and a liquid crystal panel flexible circuit board 14 (a display panel wiring member) are mounted. The driver is for driving the liquid crystal panel 11. The liquid crystal panel flexible circuit board 14 is for supplying various kinds of signals to the liquid crystal panel 11. The array substrate 11b includes a CF substrate overlapping section 11b1 (an opposed substrate overlapping section) and a CF substrate non-overlapping section 11b2 (an opposed substrate non-overlapping section). The CF substrate overlapping section 11b1 overlaps the CF board 11a in the plan view. The CF substrate non-overlapping section 11b2 is located on a side of the CF substrate overlapping section 11b1. The driver 13 and the liquid crystal panel flexible circuit board 14 are mounted on the CF substrate non-overlapping section 11b2.

Figure 7:
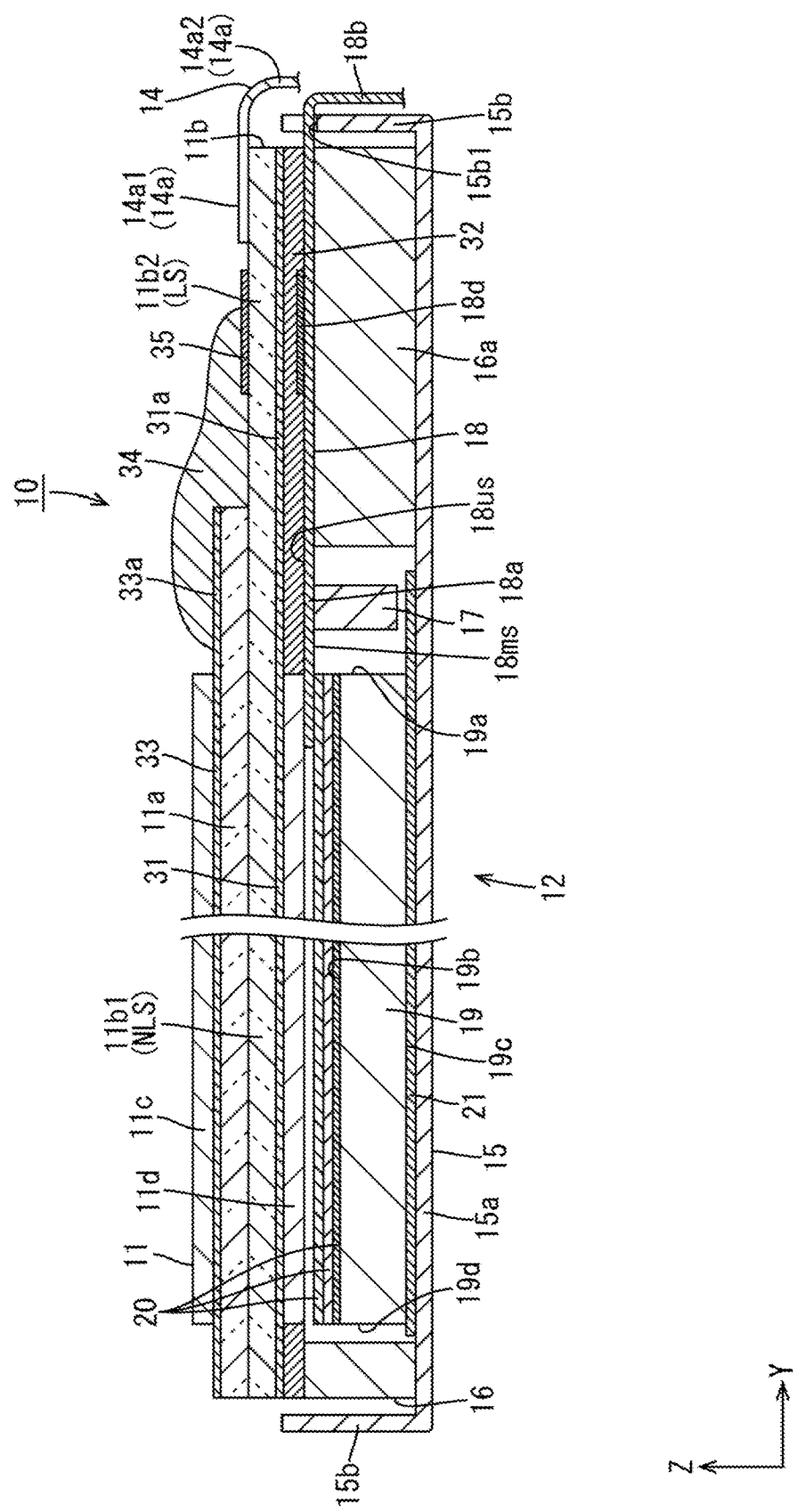
FIG. 7 is a cross-sectional view of the liquid crystal display device taken along line B-B in FIG. 6.
Figure 8:
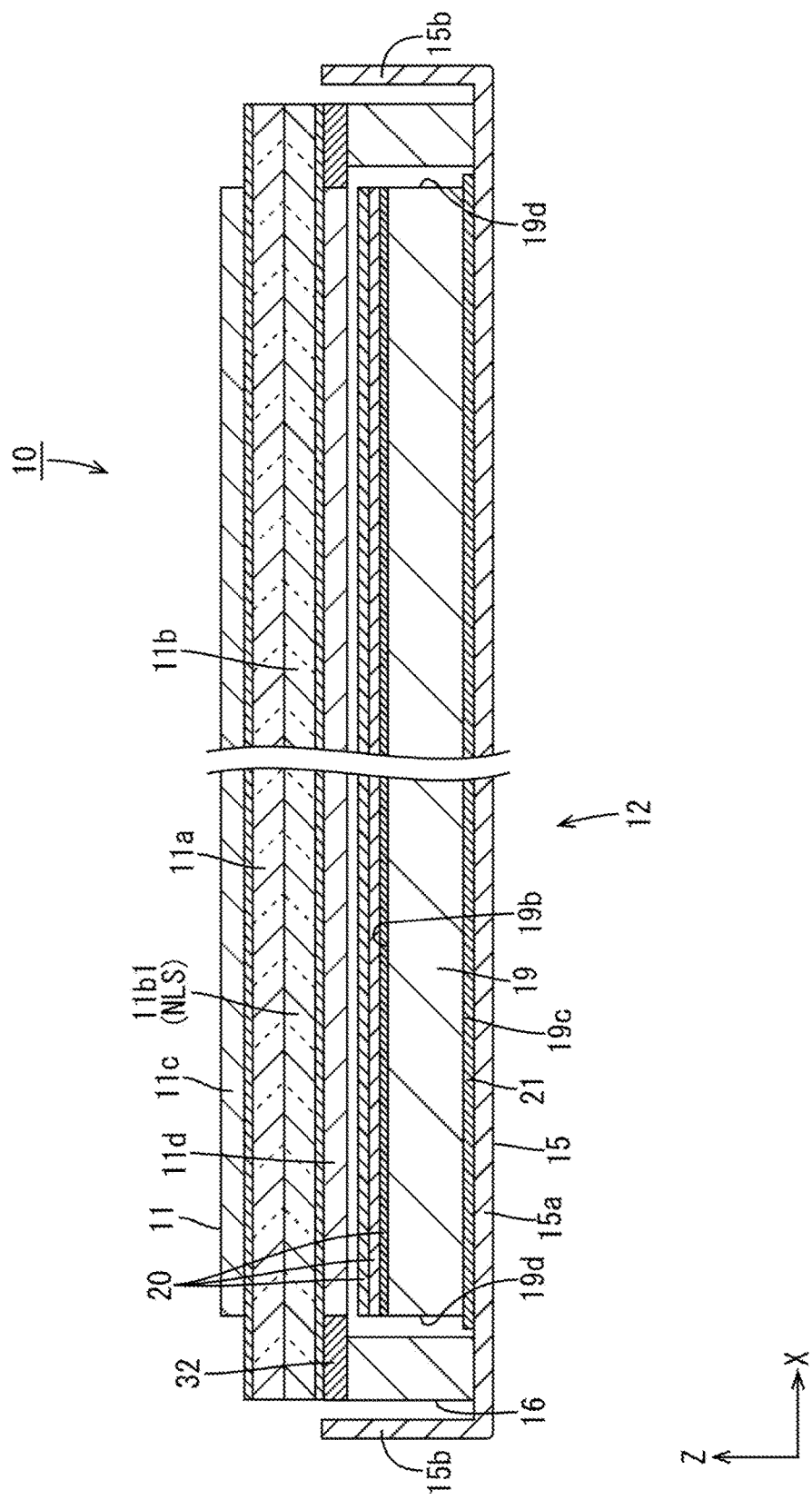
FIG. 8 is a cross-sectional view of the liquid crystal display device taken along line C-C in FIG. 6.

As illustrated in FIG. 7, polarizing plates 11c and 11d are bonded to outer surfaces of the substrates 11a and 11b. One of the polarizing plates 11c and 11d bonded to the outer surface of the array substrate 11b (a plate surface on an opposite side from the CF substrate 11a side) is a first polarizing plate 11d (a polarizing plate) and the other one of the polarizing plates 11c and 11d bonded to the outer surface of the CF substrate 11a (a plate surface on an opposite side from the array substrate 11b side) is a second polarizing plate 11c (a second polarizing plate). As illustrated in FIG. 6, the polarizing plates 11c and 11d have a rectangular shape in the plan view similarly to the substrates 11a and 11b. The long dimensions of the polarizing plates 11c and 11d are about equal to each other but smaller than those of the CF substrate 11a and the array substrate 11b. The short dimensions of the polarizing plates 11c and 11d are about equal to each other but smaller than those of the CF substrate 11a and the array substrate 11b. The polarizing plates 11c and 11d and the substrates 11c and 11d are disposed with the centers thereof substantially at the same position. Therefore, outer edge areas of the outer surfaces of the substrates 11a and 11b having a frame shape (an annular shape) are exposed without covered with the polarizing plates 11c and 11d. The polarizing plates 11c and 11d have substantially the same size in the plan view. The array substrate 11b is larger than the CF substrate 11a by the CF substrate non-overlapping section 11b2 in the plan view. As illustrated in FIGS. 7 and 8, an exposed section of the outer surface of the CF substrate 11a which is not covered with the second polarizing plate 11c has a width that is substantially constant for an entire perimeter thereof. An exposed section of the outer surface of the array substrate 11b which is not covered with the first polarizing plate 11d has a width that is not constant for an entire perimeter thereof. The width of the exposed section of the outer surface of the array substrate 11b is larger on the short side including the mounting area on which the liquid crystal panel flexible circuit board 14 is mounted by the CF substrate non-overlapping section 11b2 than on other sides.

Figure 3:
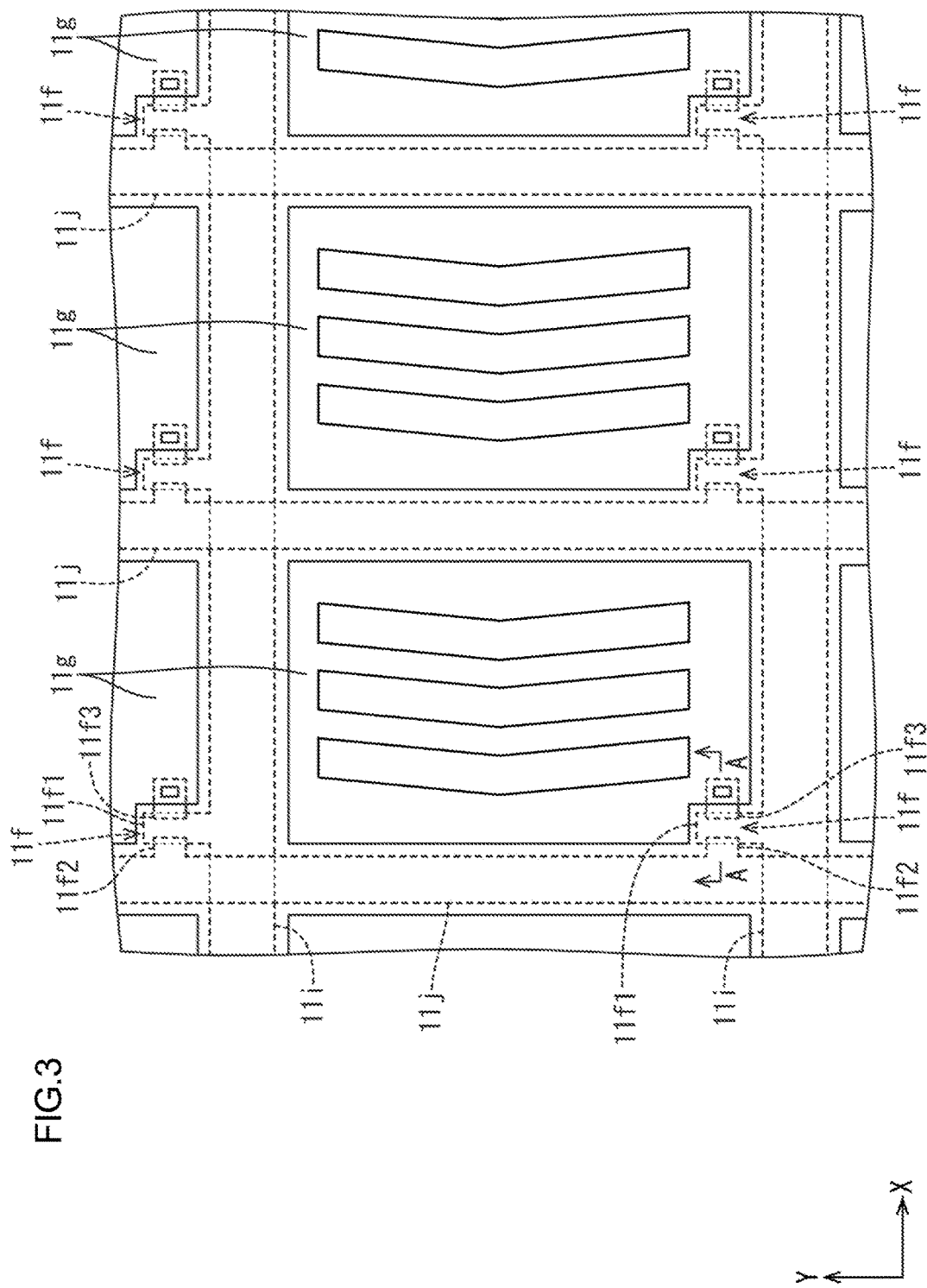
FIG. 3 is a plan view schematically illustrating a wiring configuration on an array substrate included in the liquid crystal panel in the display area.

On an inner surface of the array substrate 11b (on the liquid crystal layer 11e side, an opposed surface opposed to the CF substrate 11a), as illustrated in FIGS. 2 and 3, thin film transistors (TFTs, display components) 11f which are switching components and pixel electrodes 11g are arranged in a matrix. Gate lines 11i (scan lines) and source lines 11j (data lines, signal lines) are routed in a grid to surround the TFTs 11f and the pixel electrodes 11g. The gate lines 11i and the source lines 11j are connected to gate electrodes 11f1 and source electrodes 11f2 of the TFTs 11f, respectively. The pixel electrodes 11g are connected to drain electrodes 11f3 of the TFTs 11f. The TFTs 11f are driven based on signals supplied to the gate lines 11i and the source lines 11j. Voltages are applied to the pixel electrodes 11g in accordance with the driving of the TFTs 11f. The TFTs 11f include channels 11f4 that connect the drain electrodes 11f3 to the source electrodes 11f2. An oxide semiconductor film is used to form the channels 11f4. The oxide semiconductor film has electron mobility 20 to 50 times higher in comparison to an amorphous silicon thin material. Therefore, the TFTs 11f can be easily reduced in size to obtain an optimal amount of light transmitting through the pixel electrodes 11g (an aperture rate of display pixels). This configuration is preferable for increasing the definition of the liquid crystal panel 10 and reducing the power consumption. The pixel electrodes 11g are disposed in quadrilateral areas defined by the gate lines 11i and the source lines 11j. The pixel electrodes 11g are formed from a transparent electrode film (a second transparent electrode film 30, which will be described later) made of indium tin oxide (ITO) or zinc oxide (ZnO). A common electrode 11h is formed on the inner surface of the array substrate 11b in the display area AA such that an insulating film (a second interlayer insulating film 29, which will be described later) is disposed between the common electrode 11h and the pixel electrodes 11g. The common electrode 11h is formed from a transparent electrode film (a first transparent electrode film 28, which will be described later) similarly to the pixel electrodes 11g. The common electrode 11h is formed substantially in a solid pattern. In this embodiment, a direction in which the gate lines 11i extend and a direction in which the source lines 11j extend correspond with the X-axis direction and the Y-axis direction in each drawing, respectively.

Figure 4:
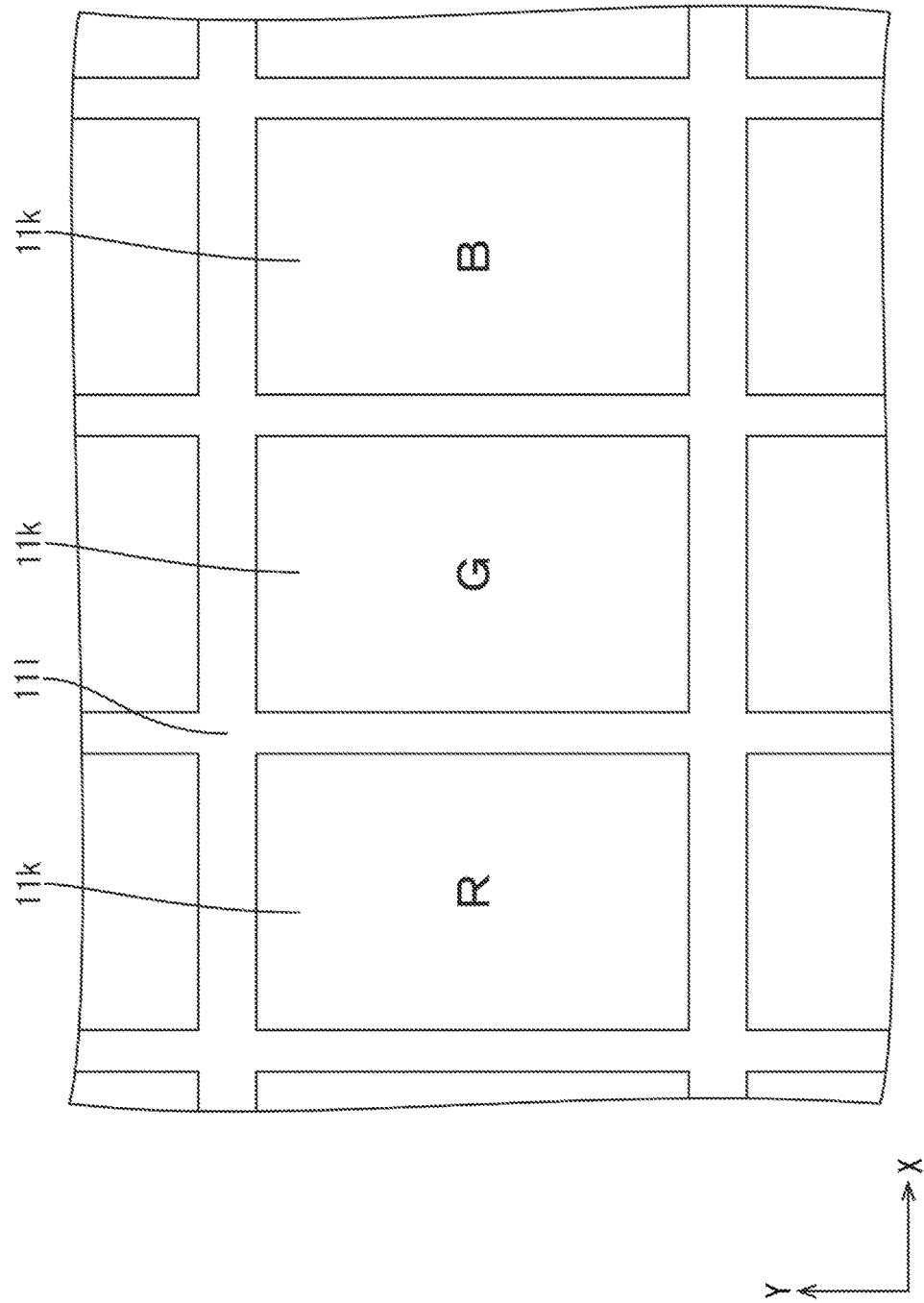
FIG. 4 is an enlarged plan view illustrating a planar configuration of a CF substrate included in the liquid crystal panel in the display area.

As illustrated in FIGS. 2 and 4, on the inner surface of the CF substrate 11a in the display area AA, color filters 11k are arranged at positions opposed to the pixel electrodes 11g on the array substrate 11b to form a matrix. The color filters 11k include red (R), green (G), and blue (B) color films in three colors. A light blocking layer 11l (a black matrix) for reducing color mixture is formed in a grid among the color filters 11k. The light blocking layer 11l overlaps the gate lines 11i and the source lines 11j in the plan view. An overcoating 11m is formed over the surfaces of the color filters 11k and the light blocking film 11l. Photo spacers, which are not illustrated, are formed on the overcoating 11m. The alignment films 11n and 11o for orientating the liquid crystal molecules in the liquid crystal layer 11e are formed on the inner surface sides of the substrates 11a and 11b, respectively. In the liquid crustal panel 11, the R color film, the G color film, and the B color film of the color filters 11k in three different colors and three pixel electrodes 11g opposed to the color films form a single display pixel, which is a unit of display. The display pixel includes a red pixel including the R color filter 11k, a green pixel including the G color filter, and a blue pixel including the B color filter 11k. Display pixels in different colors are repeatedly arranged in the row direction (the X-axis direction) on the plate surface of the liquid crystal panel 11 to form display pixel lines. The display pixel lines are arranged in the column direction (the Y-axis direction).

As illustrated in FIGS. 1 and 6, a first end of the liquid crystal panel flexible circuit board 14 is electrically connected to the CF substrate non-overlapping section 11b2 of the array substrate 11b in the non-display area NAA. A second end of the liquid crystal panel flexible circuit board 14 is electrically connected to the control circuit board CTR (see FIG. 9), which is a signal source. The liquid crystal panel flexible circuit board 14 includes a base 14a that is a film having flexibility and formed in an L-like shape in the plan view. The base 14a includes a panel mounting portion 14a1 and an extending portion 14a2. The panel mounting portion 14a1 extends along a side of the CF substrate non-overlapping section 11b2 of the array substrate 11b (the X-axis direction). The panel mounting portion 14a1 is mounted on the CF substrate non-overlapping section 11b2. The extending portion 14a2 extends from the panel mounting portion 14a1 in the Y-axis direction to an opposite side from the liquid crystal panel 11. The panel mounting portion 14a1 includes a terminal section that is not illustrated. The terminal section is electrically and mechanically connected to panel terminals that are disposed in the CF substrate non-overlapping section 11b2 of the array substrate 11b but not illustrated via an anisotropic conductive film (ACF). The extending portion 14a includes a control circuit board connecting section 14b (a signal source connecting section) at a distal end thereof and an LED board connecting section 14c in the middle thereof. The control circuit board connecting section 14b is electrically connected to the control circuit board CTR (see FIG. 9). The LED board connecting section 14c is electrically connected to an LED board 18, which will be described later. The extending portion 14a2 is folded in a U-like shape such that the distal end thereof is disposed on the back side of the backlight device 12. Therefore, the control circuit board connecting section 14b and the LED board connecting section 14c are disposed on the back side of the backlight device 12. A control circuit board connector (not illustrated) included in the control circuit board CTR on the back side of the backlight device 12 is fitted in the control circuit board connecting section 14b. A connector fitting portion 18c of the LED board 18 is fitted in the LED board connecting section 14c.

The control circuit board CTR to which the liquid crystal panel flexible circuit board 14 is connected includes a circuit (not illustrated) which includes various kinds of electronic components and wiring traces. The circuit includes at least a panel drive circuit, an LED drive circuit, and a ground circuit (see FIG. 9). The panel drive circuit is configured to supply various kinds of signals to a driver 13. The LED drive circuit is configured to supply power for driving the LEDs 17, which will be described later. The ground circuit configured to supply a ground voltage to the liquid crystal panel 11.

As illustrated in FIG. 6, the driver 13 is an LSI chip that includes a drive circuit inside. The driver 13 operates according to signals supplied by the control circuit board CTR via the liquid crystal panel flexible circuit board 14. The driver 13 processes the input singles supplied by the control circuit board CTR and generates output signals that are output to the display area AA of the liquid crystal panel 11. The driver 13 has a horizontally-long rectangular shape (an elongated shape along the short side of the liquid crystal panel 11) in the plan view. The driver 13 is directly mounted to the CF substrate non-overlapping section 11b2 of the array board 11b in the non-display area NAA, that is, the driver 13 is mounted to the CF substrate non-overlapping section through the chip on glass (COG) mounting. The long direction of the driver 13 corresponds with the X-axis direction (the short direction of the liquid crystal panel 11). The short direction of the driver 13 corresponds with the Y-axis direction (the long direction of the liquid crystal panel 11).

Next, the configuration of the backlight device 12 will be described in detail. The backlight device 12 has a block-like overall shape in the plan view similar to that of the liquid crystal panel 11. As illustrated in FIGS. 1 and 7, the backlight device 12 includes at least a chassis 15 (a casing), a frame 16, the LEDs 17 (the light emitting diodes), the LED board 18 (a lighting device power supplying member, a light source board), a light guide plate 19, optical sheets 20, and a reflection sheet 21 (a reflection member). The chassis 15 has a box-like shape with an opening on the liquid crystal panel 11 side. The frame 16 held inside the chassis 15. The LEDs 17 are light sources. The LEDs 17 are mounted on the LED board 18. The light guide plate 19 is configured to guide light rays from the LEDs 17. The optical sheets 20 are layered on the front side of the light guide plate 19. The reflection sheet 21 is disposed over the back side of the light guide plate. In the backlight device 12, the LEDs 17 (the LED board 18) are disposed on one of short sides of the backlight device 12 or the liquid crystal panel 11, specifically, closer to the short side on the CF substrate non-overlapping section 11b2. Therefore, the light rays enter the light guide plate 19 from only one side. Namely, the backlight device 12 is an edge light type (a side light type) backlight device. The frame-like non-display area NAA of the liquid crystal panel 11 includes an LED overlapping side section LS (a light source overlapping side section) and LED non-overlapping side sections NLS. The LED overlapping side section LS is one of short side sections that overlaps the LEDs 17 in the plan view. The LED non-overlapping side sections NLS are the other short side section and a pair of long side sections that do not overlap the LEDs 17. The components of the backlight device 12 will be described in sequence.

The chassis 15 is formed from a metal sheet such as an aluminum sheet and an electro galvanized steel sheet (SECC). As illustrated in FIGS. 1 and 7, the chassis 15 includes the bottom plate 15a and side plates 15b that rise frontward from edges (two long edges and two short edges) of the bottom plate 15a. The long direction of the chassis 15 (the bottom plate 15a) corresponds with the Y-axis direction and the short direction of the chassis 15 (the bottom plate 15a) corresponds with the X-axis direction. The bottom plate 15a includes a plate surface parallel to plate surfaces of the light guide plate 19 and the optical sheets 20. Circuit boards including the control circuit board CTR (see FIG. 9) are mounted to the back surface of the bottom plate 15a. The side plates 15b are disposed to surround the frame 16 from the outer sides to form a vertically-long rectangular frame shape as a whole. The side plate 15b that overlaps an extending section of the base 14a of the liquid crystal panel flexible circuit board 14 which extends outside the backlight device 12 (the side plate 15b on the short side that is on the lower side in FIG. 7) includes a pull-out void 15b1 through which the LED board 18 is pulled out, which will be described later.

The frame 16 is made of synthetic resin. As illustrated in FIGS. 1 and 7, the frame has a frame shape with an outline slightly smaller than that of the chassis 15 and slightly larger than that of the light guide plate 19. The frame 16 is held inside the chassis 15 and the frame 16 is surrounded by four side plates 15b. The frame 16 surrounds the light guide plate 19. The frame 16 has a rectangular frame shape in the plan view (viewed from a direction normal to the plate surface of the light guide plate 19). The frame 16 includes a pair of long portions that extend in the Y-axis direction and a pair of short portions that extend in the X-axis direction. The long portions and the short portions are connected to one another. One of the short portions of the frame 16 overlap the LED mounting portion 18a of the LED board 18, which will be described later, in the plan view. The short portion is configured as an LED board supporting portion 16a (a light source board supporting portion) which supports the LED mounting portion 18a from the back side (in a direction normal to the plate surface of the light guide plate 19 from the light exiting surface 19b to the opposite plate surface 19c). The LED board supporting portion 16a and an LED opposed end surface 19a of the light guide plate 19, which will be described later, sandwich the LEDs 17 with respect to the Y-axis direction (the direction normal to the LED opposed end surface 19a). The LED board supporting portion 16a has a width larger than those of other three portions of the frame 16 (two long portions and the short portion on an opposite side from the LED board supporting portion 16a). The LED board supporting portion 16a has a thickness (a height, a dimension measuring in the Z-axis direction) smaller than those of the other portions.

As illustrated in FIG. 7, each LED 17 includes a base plate and an LED chip (an LED component). The base plate is bonded to the plate surface of the LED board 18. The LED chip is a semiconductor light emitting component encapsulated in a resin on the base plate. The LED chip mounted on the base plate has one kind of a main light emitting wavelength. Specifically, the LED chip is configured to emit light rays in a single color of blue. The resin encapsulating the LED chip includes phosphors that are dispersed therein. The phosphors emit light rays in a predefined color when excited by the blur light rays emitted by the LED chip. The LED chip emits substantially white light rays. The LED 17 is a so-called side light emitting type LED including a side surface adjacent to a mounting surface attached to the LED board 18 and configured as a light emitting surface 17a.

The LED board 18 is a film (or a sheet) made of insulating material and having flexibility. As illustrated in FIGS. 1 and 7, the plate surfaces of the LED board 18 are parallel to the plate surfaces of the liquid crystal panel 11, the light guide plate 19, and the optical sheets 20. The back plate surface of the LED board 18 is configured as the LED mounting surface 18ms (the light source mounting surface) on which the LEDs 17 are mounted. The front plate surface of the LED board 18 is configured as an LED non-mounting surface 18us (a light source non-mounting surface) on which the LEDs 17 are not mounted. The wiring traces (not illustrated) for supplying power to the LEDs 17 are formed on the LED mounting surface 18ms of the LED board 18 through patterning. The LED board 18 is disposed on the front side relative to the frame 16 and the light guide plate 19 in the Z-axis direction. The LED board 18 is sandwiched between the liquid crystal panel 11 and the frame 16 and between the liquid crystal panel 11 and the light guide plate 19. The LED board 18 includes at least the LED mounting portion 18a, a pull-out wiring portion 18b, and the connector fitting portion 18c. The LEDs 17 are mounted on the LED mounting portion 18a that extends in the short direction of the backlight device 12 (the X-axis direction). The pull-out wiring portion 18b extends outward from one of ends of the LED mounting portion 18a in the Y-axis direction (toward an opposite side from the light guide plate 19). The connector fitting portion 18c is formed at a distal end of the pull-out wiring portion 18b and fitted in the LED board connector 14c of the liquid crystal panel flexible circuit board 14.

As illustrated in FIGS. 1 and 7, the LEDs 17 (ten of them in FIG. 1) are mounted on the LED mounting portions 18a at intervals in the longitudinal direction of the LED mounting portion 18a (the X-axis direction). The adjacent LEDs 17 are connected in series via the trace. The intervals of the LEDs 17 are substantially constant. Namely, the LEDs 17 are arranged at about equal intervals in the X-axis direction. A ground terminal 18d is disposed on the LED non-mounting surface 18us of the LED mounting portion 18a such that the ground terminal 18d is exposed to the front side. The ground terminal 18d is electrically connected to a ground line of the traces of the LED board 18 and thus electrically connected to the ground circuit of the control circuit board CTR via the liquid crystal panel flexible circuit board 14 (see FIG. 9). The pull-out wiring portion 18b is folded in a U-like shape toward the back side of the chassis 15 outside the chassis 15, similarly to the base 14a of the liquid crystal panel flexible circuit board 14. The connector fitting portion 18c at the distal end of the pull-out wiring portion 18b is fitted in the LED board connector 14c of the liquid crystal panel flexible circuit board 14 on the back side of the chassis 15 and connected.

As illustrated in FIGS. 1 and 7, the light guide plate 19 has a rectangular plate shape slightly smaller than inner dimensions of the frame 16 in the plan view. The plate surfaces of the light guide plate 19 are parallel to the plate surfaces of the liquid crystal panel 11. The long direction of the plate surface of the light guide plate 19 corresponds with the Y-axis direction. The short direction of the plate surface of the light guide plate 19 corresponds with the X-axis direction. The thickness direction perpendicular to the plate surface of the light guide plate corresponds with the Z-axis direction. The light guide plate 19 is held inside the chassis 15 such that ends of the light guide plate 19 are surrounded by the frame 16. The light guide plate 19 is disposed immediately behind the liquid crystal panel 11 and the optical sheets 20. A short end surface among end surfaces of the light guide plate 19 on the right side in FIG. 7 is opposed to the LEDs 17 and defined as an LED opposed end surface 19a (a light source opposed end surface) through which the light rays from the LEDs 17 enter. Other three end surfaces (the short end surface on the left side in FIG. 7 and two long end surfaces) are not opposed to the LEDs 17 as illustrated in FIGS. 7 and 8 and defined as non-LED opposed end surfaces 19d (light source non-opposed end surfaces). The LED opposed end surface 19a functions as a "light entering surface" through which the light rays emitted by the opposed LEDs 17 enter. The light rays from the LEDs 17 do not directly enter the light guide plate 19 through the LED non-opposed end surfaces 19d. The front plate surface (on the liquid crystal panel 11 side) of the front and the back plate surfaces of the light guide plate 19 is a light exiting surface 19b through which the light rays exit toward the liquid crystal panel 11. The back plate surface of the light guide plate 19 is an opposite plate surface 19c on the opposite side from the light exiting surface 19b. In this configuration, an arrangement direction in which the LED 17 and the light guide plate 19 are arranged corresponds with the Y-axis direction. An arrangement direction in which the optical sheets 20 (the liquid crystal panel 11) and the light guide plate 19 are arranged corresponds with the Z-axis direction. The arrangement directions are perpendicular to each other. The light guide plate 19 is configured such that the light rays emitted by the LEDs 17 in the Y-axis direction enter the light guide plate 19 through the LED opposed end surface 19a and travel through the light guide plate 19. The light guide plate 19 is configured to direct the light rays toward the optical sheet 20 side (the front side, the light exiting side) so that the light rays exit through the light exiting surface 19b, which is the front plate surface.

As illustrated in FIGS. 1 and 7, the optical sheets 20 have a rectangular shape in the plan view similar to that of the light guide plate 19. Plate surfaces of the optical sheets 20 are parallel to the plate surface of the liquid crystal panel 11. The long direction of the plate surfaces corresponds with the Y-axis direction. The short direction of the plate surfaces corresponds with the X-axis direction. The thickness direction perpendicular to the plate surfaces corresponds with the Z-axis direction. The optical sheets 20 are disposed on the light exiting surface 19b of the light guide plate 19 between the liquid crystal panel 11 and the light guide plate 19. The optical sheets 20 pass the light rays exiting from the light guide plate 19, exert predefined optical effects on the light rays, and direct the light rays toward the liquid crystal panel 11. The optical sheets 20 (three of them in this embodiment) are disposed on top of one another. Examples of the optical sheets 20 include diffuser sheets, lens sheets, and reflective-type polarizing sheets. Some of the sheets may be selected and used.

As illustrated in FIGS. 1 and 7, the reflection sheet 21 is disposed to cover the opposite plate surface 19c of the light guide plate 19 on the rear side, that is, the opposite side from the light exiting surface 19b. The reflection sheet 21 is formed from a synthetic resin sheet including a white surface having high light reflectivity. The reflection sheet 21 is configured to efficiently direct the light rays traveling inside the light guide plate 19 toward the front side (the light exiting surface 19b). The reflection sheet 21 has a rectangular shape with outer dimensions slightly larger than the outer dimensions of the light guide plate 19. As illustrated in FIGS. 7 and 8, an inner portion of the reflection sheet 21 is sandwiched between the light guide plate 19 and the bottom plate 15a of the chassis 15. An edge portion of the reflection sheet 21 projects outward from the end surfaces of the light guide plates 19.

In this embodiment, a driving type of the liquid crystal panel 11 is a fringe filed switching (FFS) type that is a mode improved from an in-plane switching (IPS) mode. As illustrated in FIG. 2, the pixel electrodes 11g and the common electrode 11h are formed on the array substrate 11b side among the substrates 11a, 11b and the pixel electrodes 11g and the common electrode 11h are included in different layers. Each of the CF substrate 11a and the array substrate 11b includes a substantially transparent glass substrate GS (having high transmissivity) and various films that are formed in layers on the glass substrate GS.

Figure 5:
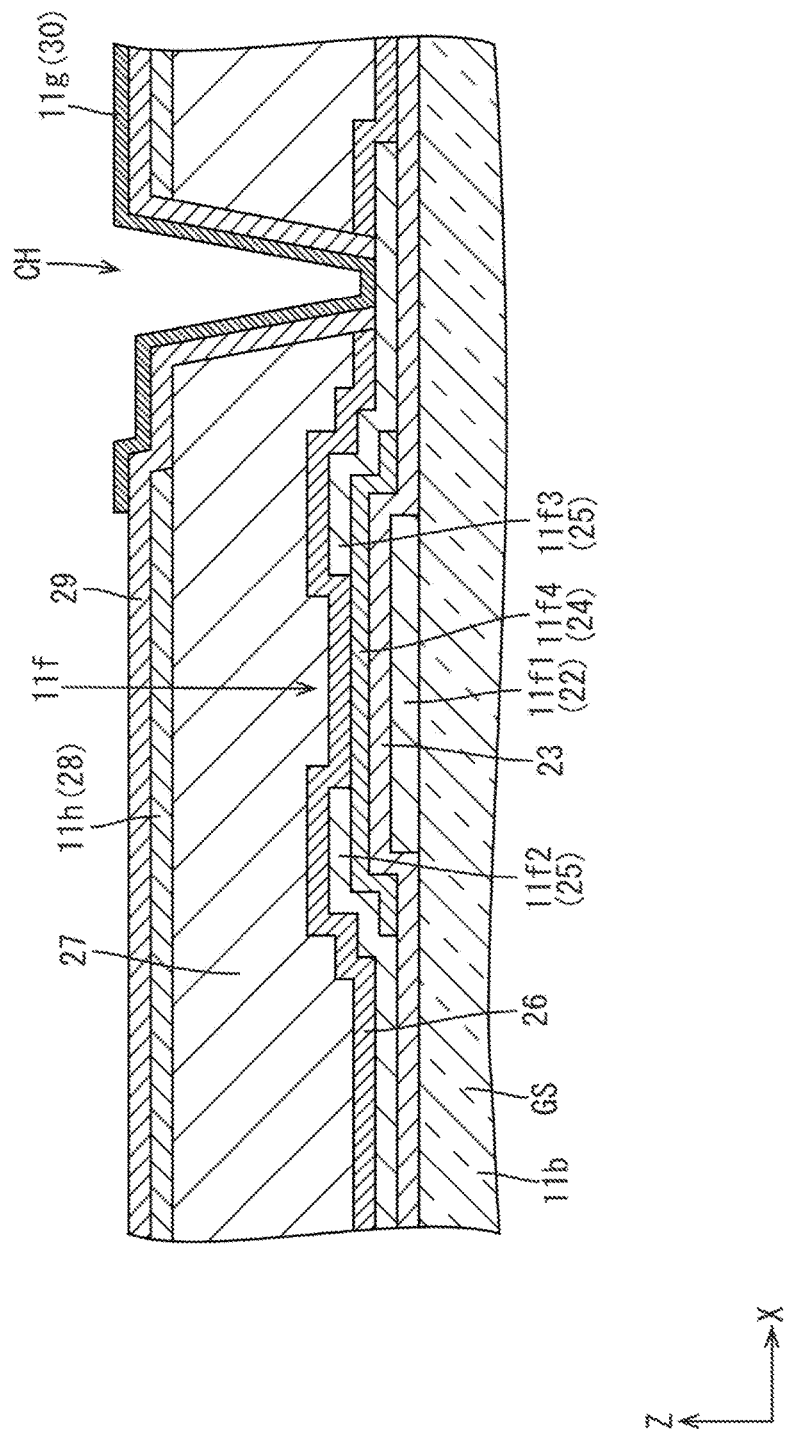
FIG. 5 is a cross-sectional view of the array substrate taken along line A-A in FIG. 3.

The various films formed in layers on the inner surface side of the array substrate 11b with the known photolithography method will be described. As illustrated in FIG. 5, on the array substrate 11b, a first metal film (a gate metal film) 22, a gate insulation film (an insulation film) 23, a semiconductor film 24, a second metal film (a source metal film) 25, a first interlayer insulation film 26, an organic insulation film 27, a first transparent electrode film 28, a second interlayer insulation film 29, a second transparent electrode film 30, and the alignment film 11o are formed in layers.

The first metal film 22 is a layered film of titanium (Ti) and copper (Cu). With such a configuration, the first metal film 22 has lower trace resistance and good conductivity compared to a layered film of titanium and aluminum (Al). The gate insulation film 23 is formed in a layer on an upper layer side of the first metal film 22 and made of silicon oxide ($SiO_2$) that is inorganic material. The semiconductor film 24 is formed in a layer on an upper layer side of the gate insulation film 23 and is a thin film including oxide semiconductors. Specific oxide semiconductors included in the semiconductor film 24 may include In—Ga—Zn—O semiconductors (indium gallium zinc oxide) containing indium (In), gallium (Ga), and zinc (Zn). The In—Ga—Zn—O semiconductor is ternary oxide of indium (In), gallium (Ga), and zinc (Zn). A ratio (composition ratio) of indium (In), gallium (Ga), and zinc (Zn) is not limited and may be In:Ga:Zn=2:2:1, In:Ga:Zn=1:1:1, or In:Ga:Zn=1:1:2, for example. In this embodiment, the In—Ga—Zn—O semiconductor contains In, Ga, and Zn at a ratio of 1:1:1. The oxide semiconductor (the In—Ga—Zn—O semiconductor) may be amorphous or may be preferably crystalline. The crystalline oxide semiconductor may be preferably a crystalline In—Ga—Zn—O semiconductor having c-axis oriented vertical to a layer surface. A crystalline structure of such an oxide semiconductor (In—Ga—Zn—O semiconductor) is disclosed in JPA 2012-134475, for example. The entire contents of JPA 2012-134475 are incorporated herein by reference.

The second metal film 25 is disposed on an upper layer side of the semiconductor film 24 and is a layered film that contains titanium (Ti) and copper (Cu) similar to the first metal film 22. According to such a configuration, the second metal film 25 has lower trace resistance and good conductivity compared to a layered film of titanium and aluminum (Al). The first interlayer insulation film 26 is formed in a layer at least on an upper layer side of the second metal film 25 and contains silicon oxide (SiO2), which is an inorganic material. The organic insulation film 27 is formed in a layer on an upper layer side of the first interlayer insulation film 26 and contains acrylic resin (e.g., polymethyl methacrylate (PMMA)), which is an organic material. The first transparent electrode film 28 is formed in a layer on an upper layer side of the organic insulation film 27 and made of transparent electrode material such as indium tin oxide (ITO) and zinc oxide (ZnO). The second interlayer insulation film 29 is formed in a layer at least on an upper layer side of the first transparent electrode film 28 and contains silicon nitride (SiNx), which is an inorganic material. The second transparent electrode film 30 is formed in a layer on an upper layer side of the second interlayer insulation film 29 and made of transparent electrode material such as indium tin oxide (ITO) and zinc oxide (ZnO) similarly to the first transparent electrode film 28. The alignment film 11o is formed in a layer at least on an upper layer side of the second transparent electrode film 30 to be exposed to the liquid crystal layer 11e. Among the insulation films 23, 26, 27, 29, the organic insulation film 27 is thicker than the inorganic insulation films 23, 26, 29 and functions as a planarization film. Among the insulation films 23, 26, 27, 29, the gate insulation film 23, the first interlayer insulation film 26, and the second insulation film 29 other than the organic insulation film 27 are inorganic insulation film containing inorganic material and thinner than the organic insulation film 27.

The TFTs 11f, the pixel electrodes 11g, and the common electrode 11h configured by the films will be described in detail. As illustrated in FIG. 5, each TFT 11f includes a gate electrode 11f1, a channel 11f4, a source electrode 11f2, and a drain electrode 11f3. The gate electrode 11f1 is formed from the first metal film 22. The channel 11f4 is formed from the semiconductor film 24 and arranged so as to overlap the gate electrode 11f1 in a plan view. The source electrode 11f2 is formed from the second metal film 25 and connected to one end of the channel 11f4. The drain electrode 11f3 is formed from the second metal film 25 and connected to another end of the channel 11f4. The channel 11f4 extends in the X-axis direction and bridges the source electrode 11f2 and the drain electrode 11f3 so that electrons move between the electrodes 11f2 and 11f3. The source electrode 11f2 and the drain electrode 11f3 are opposite at a predefined distance therebetween in the extending direction of the channel 11f4 (the X-axis direction).

As illustrated in FIG. 3, each pixel electrode 11g is formed from the second transparent electrode film 30. The pixel electrode 11g has a vertically-long rectangular overall shape in a plan view and arranged in an area defined by the gate lines 11i and the source lines 11j. The pixel electrode 11g includes longitudinal slits which form a comb-shaped portion. As illustrated in FIG. 5, the pixel electrode 11g is formed on the second interlayer insulation film 29. The second interlayer insulation film 29 is between the pixel electrode 11g and the common electrode 11h, which will be described later. A contact hole CH is formed through portions of the first interlayer insulation film 26, the organic insulation film 27, and the second interlayer insulation film 29 that are disposed under the pixel electrode 11g. The contact hole CH that is a through hole is formed at the portions of the films that overlap the drain electrode 11f3 in a plan view. The pixel electrode 11g is connected to the drain electrode 11f3 via the contact hole CH. When a voltage is applied to the gate electrode 11f1 of the TFT 11f, electrical conduction via the channel 11f4 occurs between the source electrode 11f2 and the drain electrode 11f3. As a result, a predetermined potential is applied to the pixel electrode 11g. The contact hole CH is formed not to overlap the gate electrode 11f1 and the channel 11f4 formed from the semiconductor film 24 in a plan view.

The common electrode 11h is formed from the first transparent electrode film 28 and is between the organic insulation film 27 and the second interlayer insulation film 29 as illustrated in FIG. 5. A common potential (a reference potential) is applied to the common electrode 11h through a common line, which is not illustrated. By controlling the potential applied to the pixel electrode 11g by the TFT 11f as described above, a predetermined potential difference occurs between the electrodes 11g and 11h. When a potential difference appears between the electrodes 11g and 11h, a fringe field (an oblique field) including a component in a direction normal to a plate surface of the array substrate 11b is applied to the liquid crystal layer 11e in addition to a component in a direction along the plate surface of the array substrate 11b because of the slits of the pixel electrode 11g. Therefore, not only alignment of the liquid crystal molecules in the slits in the liquid crystal layer 11e but also alignment of the liquid crystal molecules on the pixel electrode 11g is properly switchable. With this configuration, the aperture ratio of a liquid crystal panel 11 improves and a sufficient amount of transmitted light is achieved. Furthermore, high view-angle performance is achieved.

The liquid crystal panel 11 of this embodiment is driven in the FFS mode that is a lateral electric field control mode. The pixel electrode 11g and the common electrode 11h that applies an electric field to the liquid crystal layer 11e are disposed on the array substrate 11b side and are not disposed on the CF substrate 11a side. Therefore, in comparison to the array substrate 11b, the CF substrate 11a is likely to be charged on a surface thereof and static electricity is likely to remain on the CF substrate 11a. A vertical electric field may be generated due to the static electricity and an electric field in the liquid crystal layer 11e may be disturbed and a display error may be caused. In a configuration of a built-in touch panel pattern (in-cell type) for achieving multifunction of the liquid crystal panel 11, touch signals may be delayed by the noise occurring outside the liquid crystal panel 11. Sensitivity of touching may be lowered and functions of the touch panel may not be appropriately exerted. In a known configuration, a conductive film is formed on a surface of the CF substrate and the polarizing plate bonded to the array substrate is formed from conductive material. The conductive film and the polarizing plate formed from the conductive material are electrically connected to each other via a conductive tape formed stepwise such that the conductive film and the polarizing plate made of the conductive material are held at the around potential. However, workability of connecting the conductive tape to the conductive film and the polarizing plate while disposing the conductive tape according to the stepwise shape thereof is not good. Furthermore, connecting reliability of the conductive tape is not sufficient because a contact area of the conductive tape and each of the conductive film and the polarizing plate tends to be small. The polarizing plate is required to be processed to be formed in a special size or a special shape to be connected to the conductive tape.

Figure 9:
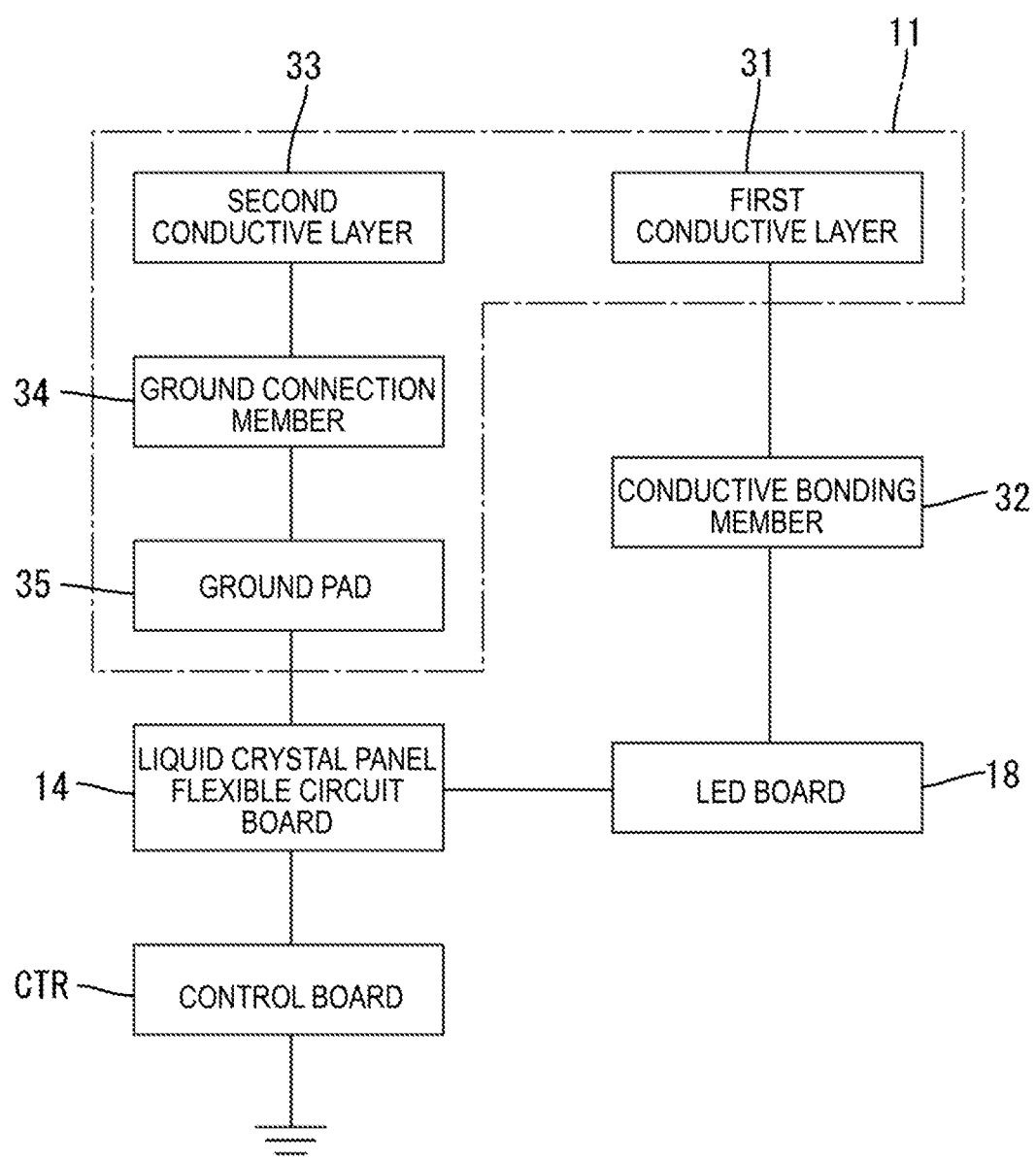
FIG. 9 is a diagram describing a path of connecting the conductive layers to ground.

In this embodiment, as illustrated in FIGS. 7 and 9, a first conductive layer 31 (a conductive layer) is disposed on an outer surface of the array substrate 11b and a conductive bonding member 32 is disposed to fix the liquid crystal panel 11 and the backlight device 12. The conductive bonding member 32 has conductivity and is connected to ground. The conductive bonding member 32 is electrically connected to the first conductive layer 31. According to such a configuration, the first conductive layer 31 is connected to ground via the conductive bonding member 32 such that the liquid crystal panel 11 can be shielded. Therefore, even in a configuration of the liquid crystal panel 11 including a built-in touch panel pattern, delay is less likely to be caused in the touch signals due to noise occurring from the rear side of the liquid crystal panel 11, that is, from the backlight device 12 side and the sensitivity of touching is less likely to be lowered. Thus, the function of the touch panel can be optimally exerted. The above configuration is preferable for achieving a multifunctional liquid crystal panel 11. The conductive bonding member 32 fixing the backlight device 12 and the liquid crystal panel 11 is electrically connected to the first conductive layer 31 to be connected to ground. An operation for connecting the first conductive layer 31 to ground is simplified and the contact area of the first conductive layer 31 and the conductive bonding member 32 is effectively ensured and high connection reliability can be obtained. Further, unlike the known configuration, the first polarizing plate 11d is not required to be formed in a special size or a special shape. Accordingly, the problems related to grounding can be solved.

Specifically, as illustrated in FIGS. 7 and 8, the first conductive layer 31 is formed from a transparent electrode film that is formed in a solid pattern over a substantially entire area of an outer surface of the array substrate 11b. The transparent electrode film of the first conductive layer 31 is made of transparent electrode material such as indium tin oxide (ITO) or zinc oxide (ZnO) and is preferably formed from the same transparent electrode material as that of the first transparent electrode film 28 and the second transparent electrode film 30 formed on the inner surface of the array substrate 11b. However, it is not limited thereto. The first conductive layer 31 is disposed on the plate surface of the array substrate 11b opposite the first polarizing plate 11d. In comparison to a configuration that a first conductive layer is disposed on a plate surface of the first polarizing plate 11d opposite from the array substrate 11b side, the first conductive layer 31 is arranged closer to the array substrate 11b. Therefore, the shielding performance of shielding the array substrate 11b is improved. Most part of a middle section of the first conductive layer 31 is covered with the first polarizing plate 11d that is bonded to the outer surface of the array substrate 11b. A frame-shaped peripheral edge section of the first conductive layer 31 does not overlap the first polarizing plate 11d and is exposed outside. An exposed section 31a (an peripheral edge section) of the first conductive layer 31 has a substantially same area as an exposed outer surface section of the array substrate 11b, and the exposed section 31a does not have a constant width over an entire peripheral area and one short-side section thereof is wider than other side sections by an area of the CF substrate non-overlapping section 11b2. A wide section of the exposed section 31a of the first conductive layer 31 overlaps the LED overlapping side section LS in the non-display area NAA of the liquid crystal panel 11 in a plan view, and three side sections (narrow sections) of the exposed section 31a of the first conductive layer 31 other than the wide section overlap the respective LED non-overlapping side sections NLS in the non-display area NAA of the liquid crystal panel 11 in a plan view. The exposed section 31a of the first conductive layer 31 is directly in contact with the conductive bonding member 32, which will be described later, such that electric connection is established between the exposed section 31 and the conductive bonding member 32.

As illustrated in FIGS. 1 and 7, a front surface of the conductive bonding member 32 is bonded to a rear plate surface of the liquid crystal panel 11 and a rear surface of the conductive bonding member 32 is bonded to front surfaces of the LED board 18 and the frame 16 of the backlight device 12. Accordingly, the liquid crystal panel 11 and the backlight device 12 are bonded to each other. The conductive bonding member 32 is formed in a rectangular frame shape (a frame shape, an annular shape), in a plan view, along the shape of the non-display area NAA of the liquid crystal panel 11 and the frame 16. The conductive bonding member 32 is bonded to a substantially entire peripheral area of the exposed section of the first conductive layer 31 disposed on the outer surface of the array substrate 11b of the liquid crystal panel 11. The exposed section is not covered with the first polarizing plate 11d. The conductive bonding member 32 surrounds the first polarizing plate 11d of the liquid crystal panel 11 over an entire perimeter from outside and does not overlap the first polarizing plate 11d. This configuration is preferable for reducing a thickness of the liquid crystal display device 10. The conductive bonding member 32 does not overlap the display area AA of the liquid crystal panel 11 and overlaps the non-display area NAA. Therefore, images displayed in the display area are less likely to be adversely affected by the conductive bonding member 32.

The conductive bonding member 32 is formed from a conductive tape including a base member made of a metal foil such as a copper foil and adhesive coated on front and rear surfaces of the base member. The conductive bonding member 32 has good conductivity and light shielding properties. As illustrated in FIGS. 7 and 8, the conductive bonding member 32 overlaps a substantially entire area of the non-display area NAA of the liquid crystal panel 11 in a plan view and the conductive bonding member 32 also overlaps substantially entire areas of the LED overlapping side section LS and the LED non-overlapping side sections NLS of the liquid crystal panel 11. More in details, the frame-shaped conductive bonding member 32 includes one short-side section overlapping the LED overlapping side section LS of the liquid crystal panel 11 and the LED board 18 in a plan view and the one short-side section is relatively wide. Other three side sections overlapping the LED non-overlapping side sections NLS of the liquid crystal panel 11 in a plan view are relatively narrow. The wide short-side section is bonded to the first conductive layer 31 disposed on the front plate surface (an LED non-mounting surface 18us) of the LED board 18 and on the rear surface of the LED overlapping side section LS of the liquid crystal panel 11. The three narrow side sections are bonded to the first conductive layer 31 disposed on front plate surfaces of the three side sections of the frame 16 (side sections other than the LED board supporting portion 16a) and on the rear surfaces of the LED non-overlapping side sections NLS of the liquid crystal panel 11. According to such a configuration, even if light rays from the LEDs 17 leak into the non-display area NAA of the liquid crystal panel 11, the leaking light rays are blocked by the conductive bonding member 32 disposed to overlap the LED overlapping side section LS of the non-display area NAA. Therefore, the leaking light rays are less likely to be seen in the non-display area of the liquid crystal panel 11 and good display quality is maintained. The conductive bonding member 32 is disposed to overlap an entire area of the LED overlapping side section LS. Therefore, the conductive bonding member 32 has a sufficient contact area contacted with the first conductive layer 31 and connection reliability between the first conductive layer 31 and the conductive bonding member 32 is ensured. The frame-shaped conductive bonding member 32 overlaps the LED non-overlapping side sections NLS in addition to the LED overlapping side section LS of the liquid crystal panel 11. Therefore, the contact area between the conductive bonding member 32 and the first conductive layer 31 is further increased and the connection reliability between the first conductive layer 31 and the conductive bonding member 32 is further ensured.

As illustrated in FIG. 7, the conductive bonding member 32 having the above configuration is directly in contact with the ground terminal 18d disposed on the LED non-mounting surface 18us, which is the front plate surface of the LED board 18, to establish electric connection. As described before, the ground terminal 18d is electrically connected to a ground line of the traces of the LED board 18. The connector fitting portion 18c of the pull-out wiring portion 18b is fitted in the LED board connector 14c of the liquid crystal panel flexible circuit board 14 and the ground terminal 18d is electrically connected to a ground circuit of the control circuit board CTR (see FIGS. 1 and 9). Thus, the first conductive layer 31 is connected to ground via the LED board 18 that supplies power to the backlight device 12.

In this embodiment, as illustrated in FIGS. 7 and 9, a second conductive layer 33 (a second conductive layer) is disposed on the outer surface of the CF substrate 11a. The second conductive layer 33 is connected to ground via a ground connection member 34 and a ground pad 35. The ground connection member 34 is disposed to extend from the CF substrate 11a to the array substrate 11b and the ground pad 35 is disposed on the array substrate 11b. According to such a configuration, in comparison to the array substrate 11b, static electricity is likely to remain on the CF substrate 11a and the CF substrate 11a is likely to be affected by static electricity, and such CF substrate 11a is optimally shielded by the second conductive layer 33. The surface of the CF substrate 11a is less likely to be charged and static electricity is less likely to remain on the surface of the CF substrate 11a, and a display error due to the static electricity is less likely to be caused. Even in a configuration of the liquid crystal panel 11 including a built-in touch panel pattern, sensitivity of touching is less likely to be lowered by delay that may be caused by noise occurring from the front side of the liquid crystal panel 11, that is, an opposite side from the backlight device 12. Functions of the touch panel can be appropriately exerted and it is preferable for achieving a multifunctional liquid crystal panel 11.

As illustrated in FIGS. 7 and 8, the second conductive layer 33 is formed from a transparent electrode film that is formed in a solid pattern over a substantially entire area of an outer surface of the CF substrate 11a. The transparent electrode film of the first conductive layer 31 is made of transparent electrode material such as indium tin oxide (ITO) or zinc oxide (ZnO) and is preferably formed from the same transparent electrode material as that of the first conductive layer 31 formed on the outer surface of the array substrate 11b. However, it is not limited thereto. The second conductive layer 33 is disposed on the plate surface of the CF substrate 11a opposite the second polarizing plate 11c. In comparison to a configuration that a second conductive layer is disposed on a plate surface of the second polarizing plate 11c opposite from the CF substrate 11a side, the second conductive layer 33 is arranged closer to the CF substrate 11a. Therefore, the shielding performance of shielding the CF substrate 11a is improved. Most part of a middle section of the second conductive layer 33 is covered with the second polarizing plate 11c that is bonded to the outer surface of the CF substrate 11a. A frame-shaped peripheral edge section of the second conductive layer 33 does not overlap the second polarizing plate 11c and is exposed outside. An exposed section 33a (an peripheral edge section) of the second conductive layer 33 has a substantially same area as an exposed outer surface section of the CF substrate 11a, and the exposed section 33a has a substantially constant width over an entire peripheral area.

The ground connection member 34 is formed from conductive paste such as silver paste. As illustrated in FIGS. 6 and 7, the ground connection member 34 includes one end that is electrically connected to the exposed section of the second conductive layer 33 on the outer surface of the CF substrate 11a and another end that is electrically connected to the ground pad 35 disposed on the array substrate 11b. The second conductive layer 33 is disposed on the outer surface of the CF substrate 11a, and the ground pad 35 is disposed on the inner surface of the array substrate 11b (the CF board non-overlapping portion 11b2). Therefore, a level difference corresponding to a thickness of the CF substrate 11a is between the second conductive layer 33 and the ground pad 35. The ground connection member 34 is formed from the conductive paste that can be freely deformed to be in a desired shape. Therefore, the ground connection member 34 can be easily disposed to extend from the ground pad 35 to the second conductive layer 33 while covering the level difference and high connection reliability can be obtained.

As illustrated in FIGS. 6 and 7, the ground pad 35 is disposed on the inner surface (a plate surface opposite from a first polarizing plate 11d side) of the CF substrate non-overlapping portion 11b2 of the array board 11b and is formed from any of the first metal film 22, the second metal film 25, the first transparent electrode film 28, and the second transparent electrode film 30. Therefore, in a process of producing the array substrate 11b, the ground pad 35 is formed on the array substrate 11b by patterning at the same time of forming any of the first metal film 22, the second metal film 25, the first transparent electrode film 28, and the second transparent electrode film 30 by patterning. The ground pad 35 is connected to the liquid crystal panel flexible circuit board 14 via the traces (not illustrated) formed on the CF board non-overlapping portion 11b2 of the array substrate 11b and is connected to ground via the liquid crystal panel flexible circuit board 14. The connector fitting portion 18c of the LED board 18 is electrically connected to the LED board connecting section 14c of the liquid crystal panel flexible circuit board 14. Therefore, supply of signals to the liquid crystal panel 11 and supply of power to the LEDs 17 of the backlight device 12 are commonly performed and the first conductive layer 31 and the second conductive layer 33 are commonly connected to ground. The ground connection member 34 overlaps a part of the ground pad 35 on the CF substrate side 11a to establish connection therebetween.

As described before, the liquid crystal display device 10 (a display device) of this embodiment includes the backlight device 12 (a lighting device) emitting light, a liquid crystal panel 11 (a display panel) disposed on a light exit side with respect to the backlight device 12, a first conductive layer 31 (a conductive layer), and a conductive bonding member 32. The liquid crystal panel 11 at least includes the array substrate 11b (a first substrate), the CF substrate 11a (a second substrate) disposed to overlap the array substrate 11b on an opposite side from a backlight device 12 side, and the first polarizing plate 11d (a polarizing plate) disposed on the array substrate 11b on the backlight device 12 side. The first conductive layer 31 is disposed on a plate surface of one of the array substrate 11b and the first polarizing plate 11d. The conductive bonding member 32 is electrically connected to the first conductive layer 31 and fixes the backlight device 12 and the liquid crystal panel 11 and is connected to ground.

According to such a configuration, the conductive bonding member 32 that is connected to ground is electrically connected to the first conductive layer 31 disposed on the plate surface of one of the array substrate 11b and the first polarizing plate 11d included in the liquid crystal panel 11. Therefore, the liquid crystal panel 11 shielded. Even in a configuration of the liquid crystal panel 11 including a built-in touch panel pattern, sensitivity of touching is less likely to be lowered by the noise occurring from the backlight device 12 side with respect to the liquid crystal panel 11 and functions of the touch panel can be appropriately exerted. It is preferable for achieving a multifunctional liquid crystal panel 11.

The conductive bonding member 32 that bonds the backlight device 12 and the liquid crystal panel 11 is electrically connected to the first conductive layer 31 and supplies ground voltage to the first conductive layer 31. An operation of connecting the first conductive layer 31 to ground is simplified and a sufficient contact area of the first conductive layer 31 and the conductive bonding member 32 is obtained and high connection reliability is achieved. Furthermore, unlike the known configuration, the first polarizing plate 11d is not required to be formed in a special size or a special shape.

The liquid crystal panel 11 is defined into the display area AA displaying images and the non-display area NAA surrounding the display area AA. The conductive bonding member 32 is arranged to overlap the non-display area NAA. According to such a configuration, the conductive bonding member 32 is less likely to adversely affect images displayed in the display area AA. The material that is opaque and excellent in conductivity such as metal can be used as the material of the conductive bonding member 32 and therefore, high connection reliability with the first conductive layer 31 can be obtained.

The backlight device 12 includes the LEDs 17 (a light source) that overlap at least one-side section of the non-display area NAA. The liquid crystal panel 11 includes a side section overlapping the LEDs 17 in the non-display area NAA as the LED overlapping side section LS (the light source overlapping side section). The conductive bonding member 32 has light blocking properties and is disposed to overlap the LED overlapping side section LS in the non-display area NAA. Accordingly, even if the light rays from the LEDs 17 leak into the non-display area NAA side of the liquid crystal panel 11, the leaking light rays are blocked by the conductive bonding member 32 disposed to overlap the LED overlapping side section LS of the non-display area NAA. Accordingly, the leaking light rays are less likely to be seen in the non-display area of the liquid crystal panel 11 and display quality is improved.

The liquid crystal panel 11 includes side sections that do not overlap the LEDs 17 in the non-display area NAA as the LED non-overlapping side sections NLS (the light source non-overlapping side sections). The conductive bonding member 32 is formed in an area overlapping an entire area of at least the LED overlapping side section LS. Thus, the conductive bonding member 32 is at least formed in an area overlapping an entire area of the LED overlapping side section LS that is wider than the LED non-overlapping side sections NLS. Therefore, a sufficient contact area of the conductive bonding member 32 and the first conductive layer 31 is ensured, and high connection reliability between the first conductive layer 31 and the conductive bonding member 32 can be obtained.

The conductive bonding member 32 is formed in an annular shape along the shape of the non-display area NAA and overlaps the LED non-overlapping side sections NLS in addition to the LED overlapping side section LS. Accordingly, the conductive bonding member 32 that is formed in an annular shape along the shape of the non-display area NAA and overlaps the LED non-overlapping side sections NLS in addition to the LED overlapping side section LS is in contact with the first conductive layer 31. Therefore, the contact area of the conductive bonding member 32 and the first conductive layer 31 is further increased and the connection reliability of the first conductive layer 31 and the conductive bonding member 32 is further increased.

The LED board 18 (a lighting device power supplying member) for supplying power to the backlight device 12 is included and the conductive bonding member 32 is electrically connected to the LED board 18. Accordingly, the conductive bonding member 32 can be easily connected to ground via the LED board 18 for supplying power to the backlight device 12.

The LED board 18 includes the LEDs 17 emitting light rays, the LED mounting portion 18a, and the pull-out wiring portion 18b. The LEDs 17 are mounted on the LED mounting portion 18a. The LED mounting portion 18a has the LED non-mounting surface 18us (light source non-mounting surface) that is an opposite surface from a surface where the LEDs 17 are mounted. The LED non-mounting surface 18us is opposite the liquid crystal panel 11. The pull-out wiring portion 18b is pulled outside the backlight device 12 from the LED mounting portion 18a. The ground terminal 18d is disposed on the LED non-mounting surface 18us of the LED mounting portion 18a. The conductive bonding member 32 is contacted with the LED non-mounting surface 18us of the LED mounting portion 18a and electrically connected to the ground terminal 18d. According to such a configuration, the conductive bonding member 32 is disposed to be in contact with the LED non-mounting surface 18us of the LED mounting portion 18a included in the LED board 18 such that the conductive bonding member 32 is electrically connected to the ground terminal 18d on the LED non-mounting surface 18us. Thus, the first conductive layer 31 is connected to ground.

The display device further includes the second conductive layer 33 (a second conductive layer), the second polarizing plate 11c (a second polarizing plate), and the ground connection member 34. The second conductive layer 33 is disposed on the plate surface of the CF substrate 11a opposite from the array substrate 11b side. The second polarizing plate 11c is bonded to the plate surface of the CF substrate 11a opposite from the array substrate 11b side such that a part of the second conductive layer 33 is exposed. One end of the ground connection member 34 is electrically connected to the exposed section of the second conductive layer 33 and another end thereof is connected to ground. According to such a configuration, the second polarizing plate 11c bonded to the plate surface of the CF substrate 11a opposite from the array substrate 11b side is formed such that the second conductive layer 33 that is disposed on the plate surface of the CF substrate 11a opposite from the array substrate 11b side is partially exposed. The one end of the ground connection member 34 is connected to the exposed section of the second conductive layer 33 and the liquid crystal panel 11 is shielded. Even in a configuration of the liquid crystal panel 11 including a built-in touch panel pattern, sensitivity of touching is less likely to be lowered by the noise occurring from an opposite side from the backlight device 12 side with respect to the liquid crystal panel 11 and functions of the touch panel can be appropriately exerted. It is preferable for achieving a multifunctional liquid crystal panel 11.

The array substrate 11b includes the CF substrate non-overlapping section 11b2 (the second substrate non-overlapping section) that does not overlap the CF substrate 11a and the ground pad 35 is disposed on the CF substrate non-overlapping section 11b2. The liquid crystal panel flexible circuit board 14 (the display panel wiring member) is mounted on the array substrate 11b and transfers at least the signals for display images and the ground pad 35 is connected to ground via the liquid crystal panel flexible circuit board 14. The ground connection member 34 is formed from the conductive paste that is disposed extending from the grand pad 35 to the exposed section of the second conductive layer 33. The ground pad 35 is connected to ground via the liquid crystal panel flexible circuit board 14 mounted on the array substrate 11b. Therefore, the second conductive layer 33 of the CF substrate 11a that is connected to the ground pad 35 of the array substrate 11b is connected to around via the ground connection member 34. A level difference corresponding to a thickness of the CF substrate 11a is between the second conductive member 33 disposed on the CF substrate 11a and the ground pad 35 disposed on the CF substrate non-overlapping section 11b2 of the array substrate 11b. The ground connection member 34 is formed from the conductive paste such that the ground connection member 34 can be easily disposed to extend from the ground pad 35 to the exposed section of the second conductive layer 33 while covering the level difference and effective connection can be established.

The display device further includes the LED board 18 that supplies power to the backlight device 12. The liquid crystal panel flexible circuit board 14 includes the LED board connecting section 14c (a connecting section) that is electrically connected to the LED board 18. Accordingly, the LED board 18 is electrically connected to the LED board connecting section 14c of the liquid crystal panel flexible circuit board 14 such that the first conductive layer 31 and the second conductive layer 33 are commonly connected to around.

The first conductive layer 31 is disposed on the first polarizing plate 11d side plate surface of the array substrate 11b. Accordingly, the electric connection between the first conductive layer 31 and the conductive bonding member 32 can be established by arranging the conductive bonding member 32 so as to overlap the array substrate 11b on the first polarizing plate 11d side. In comparison to a configuration that the first conductive layer is disposed on a plate surface of the first polarizing plate 11d opposite from the array substrate 11b side, the first conductive layer 31 is arranged closer to the array substrate 11b. Therefore, the shielding performance of shielding the array substrate 11b is improved.

The conductive bonding member 32 is disposed not to overlap the first polarizing plate 11d. Such a configuration is preferable for reducing a thickness in comparison to a configuration that the conductive bonding member is disposed to overlap the first polarizing plate 11d.

The first conductive layer 31 is formed from a transparent electrode film. According to such a configuration, high transmissivity and high conductivity can be obtained.

Second Embodiment

A second embodiment of the present technology will be described with reference to FIG. 10. In the second embodiment, arrangement of a first conductive layer 131 is altered. Configurations, operations, and effects that are similar to those of the first embodiment will not be described.

Figure 10:
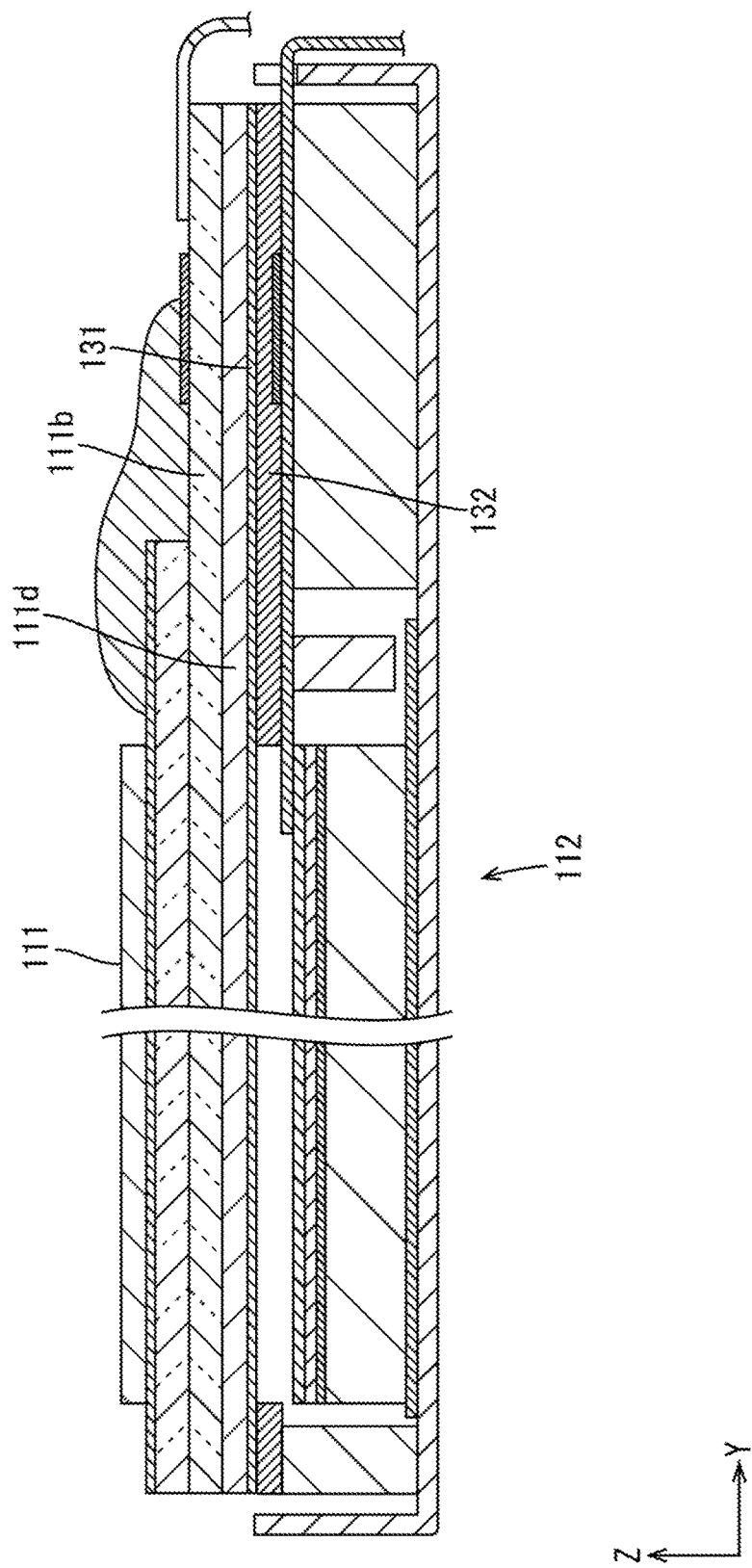
FIG. 10 is a cross-sectional view of a liquid crystal display device according to a second embodiment of the present invention.

As illustrated in FIG. 10, the first conductive layer 131 of this embodiment is disposed on an outer surface of a first polarizing plate 111d, that is a plate surface of the first polarizing plate 111d opposite from an array substrate 111b side. The first polarizing plate 111d is directly bonded to the outer surface of the array substrate 111b without having the first conductive layer 131 therebetween. The first polarizing plate 111d has a substantially same plan view size as the array substrate 111b and is disposed to cover a substantially entire area of the outer surface of the array substrate 111b. The first conductive layer 131 is disposed in a solid pattern over a substantially entire area of the outer surface of the first polarizing plate 111d and a forming area of the first conductive layer 131 is substantially same as that of the first conductive layer 31 in the first embodiment. An entire area of the first conductive layer 131 is exposed at the outer surface of the first polarizing plate 111d.

The first conductive layer 131 includes a light transmissive base member and conductive particles contained in the light transmissive base member. The light transmissive base member is made of substantially transparent light transmissive resin material. Adhesive is coated on a surface of the first conductive layer 131 opposite the outer surface of the first polarizing plate 111d and the first conductive layer 131 is bonded to the outer surface of the first polarizing plate 111d with the adhesive. In comparison to the configuration of the first embodiment including the first conductive layer 31 formed from the transparent electrode film on the outer surface of the array substrate 111b, the first conductive layer 131 can be disposed at a lower cost. A conductive bonding member 132 is bonded on an outer surface side of the first polarizing plate 111d, and a liquid crystal panel 111 and a backlight device 112 are fixed with the conductive bonding member 132 and the conductive bonding member 132 is electrically connected to the first conductive layer 131 via the conductive bonding member 132.

As described before, according to this embodiment, the first conductive layer 131 is disposed on the plate surface of the first polarizing plate 111d opposite from the array substrate 111b side. The conductive bonding member 132 is disposed to overlap the first polarizing plate 111d on an opposite side from the array substrate 111b side. Accordingly, electrical connection between the first conductive layer 131 and the conductive bonding member 132 can be established. In comparison to a configuration including the first conductive layer directly on the plate surface of the array substrate 111b, the first conductive layer 131 can be disposed at a lower cost.

The first conductive layer 131 includes the light transmissive base member and the conductive particles contained in the light transmissive base member. Accordingly, in comparison to a configuration including first conductive layer formed from a transparent electrode film directly on the plate surface of the array substrate 111b, a cost is preferably reduced.

Third Embodiment

A third embodiment of the present technology will be described with reference to FIG. 11. The third embodiment differs from the first embodiment in that an LED driving board 36 is included. Configurations, operations, and effects that are similar to those of the first embodiment will not be described.

Figure 11:
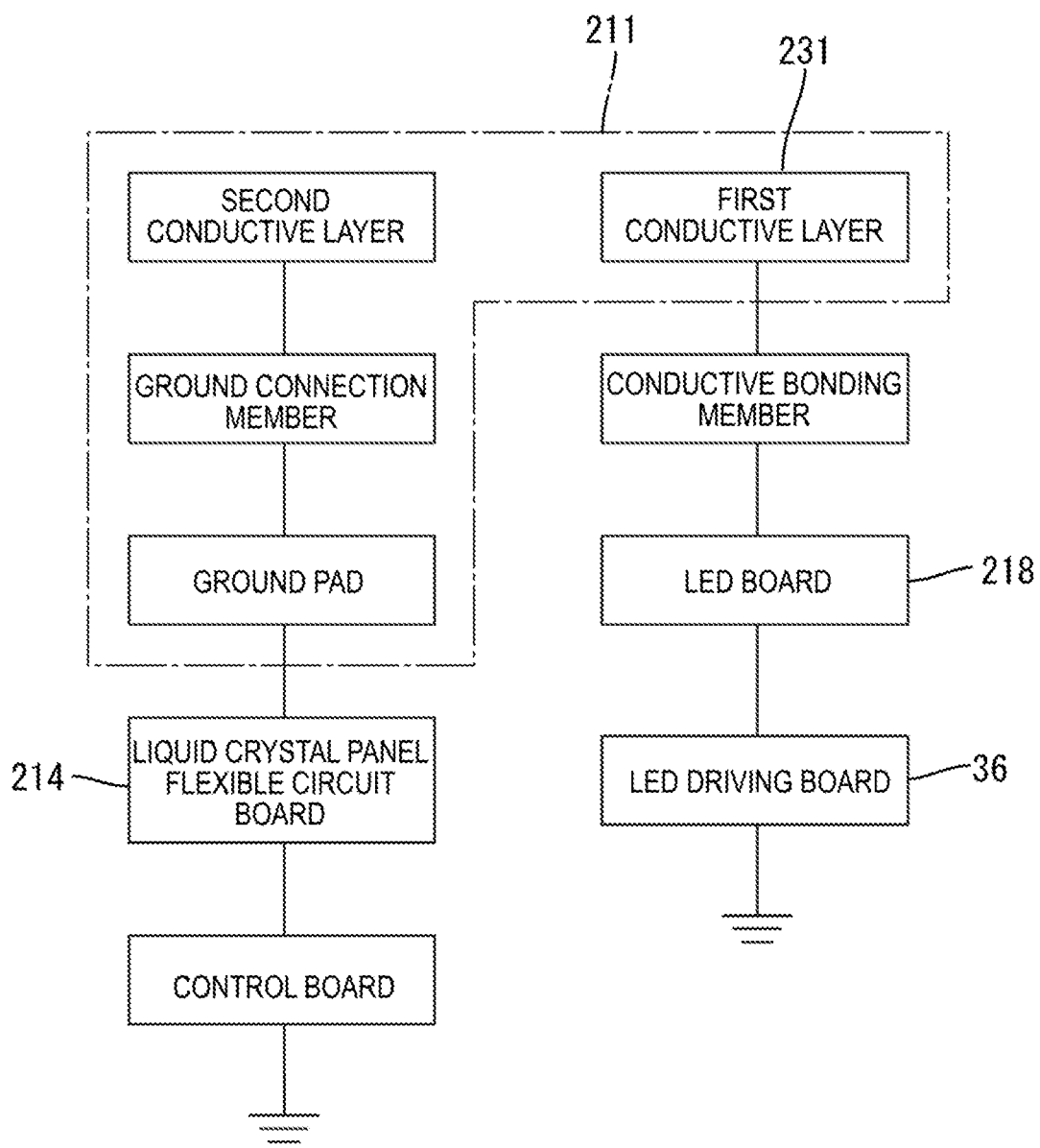
FIG. 11 is a diagram describing a path of connecting a second conductive layer to ground according to a third embodiment of the present invention.

According to this embodiment, as illustrated in FIG. 11, an LED board 218 is not electrically connected to a liquid crystal panel flexible circuit board 214 but to the LED driving board 36. A circuit (not illustrated) including various electronic components and trace patterns is mounted on the LED driving board 36. The circuit includes at least an LED driving circuit for supplying driving power to the LEDs on the LED board 218 and a ground circuit for supplying a ground potential to a liquid crystal panel 211. The LED board 218 is electrically connected to the LED driving board 36 such that the driving power is supplied to the LEDs via the LED driving circuit and a first conductive layer 231 is maintained at a ground potential by the ground circuit.

Fourth Embodiment

A fourth embodiment of the present technology will be described with reference to FIG. 12. The fourth embodiment differs from the first embodiment in that a conductive bonding member 332 is connected to ground via a chassis 315 of a backlight device. Configurations, operations, and effects that are similar to those of the first embodiment will not be described.

Figure 12:
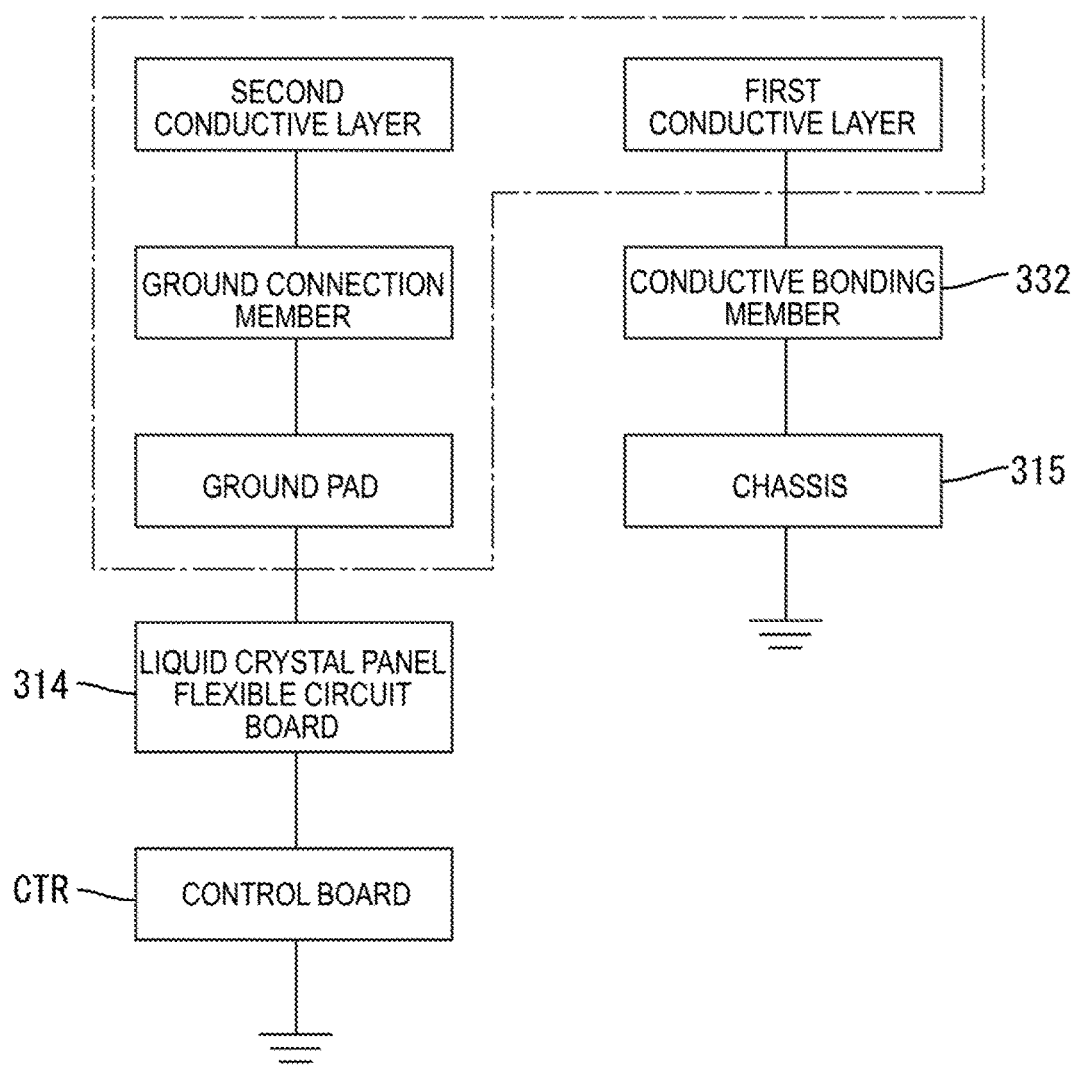
FIG. 12 is a diagram describing a path of connecting a second conductive layer to ground according to a fourth embodiment of the present invention.

According to this embodiment, as illustrated in FIG. 12, the conductive bonding member 332 is electrically connected to the chassis 315 included in the backlight device. The chassis 315 is connected to ground. Accordingly, the conductive bonding member 332 is held at a ground potential via the chassis 315. An LED board, which is not illustrated, may be electrically connected to a control board CTR via a liquid crystal panel flexible circuit board 314 similarly to the first embodiment or may be electrically connected to an LED driving board, which is not illustrated, similarly to the third embodiment.

Other Embodiments

The present invention is not limited to the above embodiments described in the above sections and the drawings. For example, the following embodiments may be included in technical scopes of the present invention.

(1) In the first embodiment, the first conductive layer and the second conductive layer are formed from the transparent electrode film. However, one of both of the first conductive layer and the second conductive layer may be formed from a light transmissive base member and conductive particles contained in the light transmissive base member similarly to the first conductive layer of the second embodiment.

(2) In the first embodiment, the conductive bonding member is contacted with a substantially entire area of the exposed section of the first conductive layer that is not covered with the first polarizing plate. However, the conductive bonding member may be contacted with a part of the exposed section of the first conductive layer. For example, the conductive bonding member may be disposed to be contacted with three side sections or two side sections or one side section of the frame-shaped exposed section of the first conductive layer. In such a configuration, it is preferable to dispose the conductive bonding member selectively to be contacted with the wide portion of the exposed section of the first conductive layer for ensuring sufficient contact area and shielding the leaking light rays from the LEDs. However, it is not limited thereto.

(3) As an example of the configuration including the conductive bonding member contacted with only a part of the exposed section of the first conductive layer like the configuration of (2), the conductive bonding member may be contacted with a part of the side section, with respect to a width dimension thereof, included in the exposed section of the first conductive layer.

(4) In the first embodiment, the first polarizing plate is slightly smaller than the array substrate, and the exposed section of the first conductive layer has a frame shape in a plan view. A long-side dimension (a short-side dimension) of the first polarizing plate may be smaller than a long-side dimension (a short-side dimension) of the array substrate and the short-side dimension (a long-side dimension) of the first polarizing plate may be substantially equal to the short-side dimension (along-side dimension) of the array substrate. The exposed sections of the first conductive layer may be formed in a belt-like shape in a plan view and may be disposed to sandwich the first polarizing plate from two sides with respect to the long-side direction (the short-side direction). Other than the above configuration, the exposed section of the first conductive layer having the belt-like shape may be disposed on only one side section of the non-display area of the array substrate. As the area of the disposed section of the first conductive layer is altered, a forming area of the conductive bonding member is preferably altered. However, plan view shapes of the exposed section of the first conductive layer and the conductive bonding member do not necessarily match.

(5) In the first embodiment, the first conductive layer is disposed over a substantially entire area of the outer surface of the array substrate. However, the first conductive layer may be disposed over an entire area of the display area of the outer surface of the array substrate and a section of the non-display area next to the display area, and the first conductive layer may not be disposed on peripheral edge portions of the non-display area. Such a configuration is similar to the second conductive layer disposed on the outer surface of the CF substrate.

(6) In the second embodiment, the first conductive layer is disposed over a substantially entire area of the outer surface of the first polarizing plate. However, the first conductive layer may be disposed over a substantially entire area of the display area on the outer surface of the first polarizing plate and a section of the non-display area next to the display area, and the first conductive layer may not be disposed on peripheral edge portions of the non-display area.

(7) In the second embodiment, the first polarizing plate is disposed on a substantially entire area of the outer surface of the array substrate. However, the first polarizing plate may be disposed over a substantially entire area of the display area on the outer surface of the array substrate and a section of the non-display area next to the display area, and the first polarizing plate may not be disposed on peripheral edge portions of the non-display area.

(8) As a modification of the second embodiment, the first conductive layer may be disposed on the outer surface of the first polarizing plate by printing.

(9) The configuration of each of the third and four embodiments may be included in the configuration of the second embodiment.

(10) In the fourth embodiment, the LED board is not electrically connected to the conductive bonding member and therefore, the LED board can be arranged in various places in the backlight device. The LED board may be arranged on a rear side with respect to the LEDs or the LEDs of a top surface light emission type may be arranged on an opposite side from a light guide plate side with respect to the LEDs.

(11) in each of the above embodiments, the backlight device of one-side light emission type is described. A backlight device of two-sides light emission type including a pair of long-side edge surfaces or a pair of short-side edge surfaces of the light guide plate as LED opposite edge surfaces is also included in the scope of the present invention. A backlight device of three-sides light emission type including any three edge surfaces of peripheral edge surfaces of the light guide plate as the LED opposite surfaces is also included in the scope of the invention. A backlight device of four-sides light emission type including all of the four peripheral edge surfaces of the light guide plate as the LED opposite surfaces is also included in the scope of the invention.

(12) In each of the above embodiments, the driver is mounted on the array substrate of the liquid crystal panel through the chip on glass (COG) mounting. However, the driver may be mounted on the liquid crystal panel flexible circuit board through the chip on film (COF) mounting.

(13) In each of the above embodiments, the liquid crystal display device includes a liquid crystal panel of a rectangular plan view shape. However, a liquid crystal display device including a liquid crystal panel of a plan view shape of a square, a circle, or an oval is also included in the scope of the invention.

(14) Specific detection methods of a build-in touch panel pattern in a liquid crystal panel according to each of the embodiments may include an electrostatic capacitance type, a contact type, an optical type, a hybrid type, and an electronic paper type, and any of the detection methods can be applied in each of the above embodiments.

(15) In each of the above embodiments, the liquid crystal panel includes the touch panel pattern therein. A structure exerting functions other than the touch panel function may be included in the liquid crystal panel.

(16) In each of the above embodiments, the semiconductor film configuring the channel portion of the TFTs includes the oxide semiconductor material. Polysilicon (polycrystallized silicon (polycrystalline silicon)) such as continuous grain silicon (CG silicon) or amorphous silicon may be used as the semiconductor film.

(17) Each of the above embodiments includes the liquid crystal panel of a lateral electric field type that includes an FFS mode as an operation mode. A liquid crystal panel that includes an in-plane switching (IPS) mode or a liquid crystal panel that includes a vertical alignment (VA) mode is also included in the scope of the present invention.

(18) In each of the above embodiments, the color filters of the liquid crystal panel include filters of three colors including red, green, and blue. In addition to the red, green and blue color portions, a yellow color portion may be included and the liquid crystal panel including the color filters of four colors is also included in the scope of the present invention.

(19) Each of the above embodiments includes the liquid crystal panels that are classified as small sized or small to middle sized panels. However, liquid crystal panels that are classified as middle sized or large sized (or supersized) panels having screen sizes from 20 inches to 90 inches are also included in the scope of the present invention. Such display panels may be used in electronic devices including television devices, digital signage, and electronic blackboard.

(20) In each of the above embodiments, the liquid crystal panel includes boards and the liquid crystal layer sandwiched therebetween. A liquid crystal panel including the boards and functional organic molecules other than the liquid crystal material is also included in the scope of the present invention.

(21) Each of the above embodiments includes the TFTs as switching components of the liquid crystal display panel. However, liquid crystal display panels that include switching components other than TFTs (e.g., thin film diodes (TFDs)) may be included in the scope of the present invention. Furthermore, black-and-white liquid crystal display panels, other than color liquid crystal display panels, are also included in the scope of the present invention.

(22) In each of the above embodiments, the liquid crystal display panels are described as the display panels. However, other types of display panels (e.g., plasma display panels (PDPs), organic EL panels, electrophoretic display (EPD) panels, micro electro mechanical systems (MEMS) display panels) are also included in the scope of the present invention.

EXPLANATION OF SYMBOLS

10: liquid crystal display device (display device), 11, 111, 211: liquid crystal panel (display panel), 11a: CF substrate (second substrate), 11b, 111b: array substrate (first substrate), 11b: CF substrate non-overlapping section (second substrate non-overlapping section), 11c: second polarizing plate (second polarizing plate), 11d, 111d: first polarizing plate (polarizing plate), 12, 112: backlight device (lighting device), 14, 214, 314: liquid crystal panel flexible circuit board (display panel wiring member), 14c: LED board connecting section (connecting section), 17: LED (light source), 18, 218: LED board (lighting device power supply member), 18a: LED mounting portion (light source mounting portion), 18b: pull-out wiring portion, 18d: ground terminal, 18us: LED non-mounting surface (light source non-mounting surface), 31, 131, 231: first conductive layer (conductive layer), 32, 132, 332: conductive bonding member, 33: second conductive layer (second conductive layer), 34: around connection member, 35: ground pad, AA: display area, LS: LED overlapping side section (light source overlapping side section), NAA: non-display area, NLS: LED non-overlapping side section (light source non-overlapping side section)

The invention claimed is:
1. A display device comprising:
a lighting device exiting light;
a display panel disposed on a light exit side with respect to the lighting device, the display panel including a first substrate, a second substrate overlapping the first substrate on an opposite side from a lighting device side, and a polarizing plate disposed on the lighting device side with respect to the first substrate;
a conductive layer disposed on a plate surface of one of the first substrate and the polarizing plate; and
a conductive bonding member electrically connected to the conductive layer and bonding the lighting device and the display panel and connected to ground, wherein
a second conductive layer disposed on a plate surface of the second substrate opposite from the first substrate side;
a second polarizing plate bonded to a plate surface of the second substrate opposite from the first substrate side and disposed to expose a section of the second conductive layer as an exposed section; and
a ground connection member having one end electrically connected to the exposed section of the second conductive layer and another end connected to ground.

2. The display device according to claim 1, wherein
the display panel includes a display area displaying images and a non-display area surrounding the display area, and
the conductive bonding member is disposed to overlap the non-display area.

3. The display device according to claim 2, wherein
the lighting device includes a light source disposed to overlap at least one side section of the non-display area, and the display panel includes the one side section overlapping the light source in the non-display area as a light source overlapping side section, and
the conductive bonding member has light blocking properties and is disposed to overlap the light source overlapping side section of the non-display area.

4. The display device according to claim 3, wherein
the display panel includes another side section of the non-display area that does not overlap the light source as a light source non-overlapping side section, the light source non-overlapping side section is narrower than the light source overlapping side section, and
the conductive bonding member is disposed over an area overlapping an entire area of at least the light source overlapping side section.

5. The display device according to claim 4, wherein the conductive bonding member has an annular shape that is along a shape of the non-display area and the conductive bonding member is disposed to overlap the light source non-overlapping side section in addition to the light source overlapping side section.

6. The display device according to claim 1, further comprising a lighting device power supply member for supplying power to the lighting device, wherein
the conductive bonding member is electrically connected to the lighting device power supply member.

7. The display device according to claim 6, wherein
the lighting device power supply member includes a light source emitting light, a light source mounting portion, a pull-out wiring portion, and a ground terminal,
the light source mounting portion has a mounting surface where the light source is mounted and a light source non-mounting surface opposite from the mounting surface, and the light source non-mounting surface is opposite the display panel,
the pull-out wiring portion is pulled out from the light source mounting portion to an outside of the lighting device, and the ground terminal is disposed on the light source non-mounting surface of the light source mounting portion, and the conductive bonding member is in contact with the light source non-mounting surface of the light source mounting portion and is electrically connected to the ground terminal.

8. The display device according to claim 1, further comprising:
- a ground pad disposed on a second substrate non-overlapping section of the first substrate, the second substrate non-overlapping section not overlapping the second substrate; and
- a display panel wiring member mounted on the first substrate and transmitting at least signals for displaying images and connecting the ground pad to ground, wherein the ground connection member is formed from conductive paste disposed to extend from the ground pad to the exposed section of the second conductive layer.

9. The display device according to claim 8, further comprising a lighting device power supplying member supplying power to the lighting device, wherein
the display panel wiring member includes a connecting section that is electrically connected to the lighting device power supplying member.

10. The display device according to claim 1, wherein the conductive layer is disposed on a plate surface of the first substrate on a polarizing plate side.

11. The display device according to claim 10, wherein the conductive bonding member is disposed not to overlap the polarizing plate.

12. The display device according to claim 10, wherein the conductive layer is formed from a transparent electrode film.

13. The display device according to claim 1, wherein the conductive layer is disposed on a plate surface of the polarizing plate opposite from a first substrate side.

14. The display device according to claim 13, wherein the conductive layer includes a light transmissive base member and conductive particles contained in the light transmissive base member.

* * * * *